United States Patent
Hirakawa et al.

(10) Patent No.: US 9,613,797 B2
(45) Date of Patent: Apr. 4, 2017

(54) CLEANING DEVICE, PEELING SYSTEM, CLEANING METHOD AND COMPUTER-READABLE STORAGE MEDIUM

(71) Applicant: TOKYO ELECTRON LIMITED, Tokyo (JP)

(72) Inventors: Osamu Hirakawa, Koshi (JP); Takashi Sakaue, Kumamoto (JP); Hiroshi Komeda, Koshi (JP); Katsuhiro Iino, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 123 days.

(21) Appl. No.: 14/695,103

(22) Filed: Apr. 24, 2015

(65) Prior Publication Data

US 2015/0314339 A1    Nov. 5, 2015

(30) Foreign Application Priority Data

May 1, 2014   (JP) ................................. 2014-094581

(51) Int. Cl.
*B08B 7/00*  (2006.01)
*H01L 21/02*  (2006.01)
*H01L 21/67*  (2006.01)

(52) U.S. Cl.
CPC .... *H01L 21/02057* (2013.01); *H01L 21/6708* (2013.01); *H01L 21/67028* (2013.01)

(58) Field of Classification Search
CPC .. B08B 3/08; H01L 21/02057; H01L 21/6708
USPC ............................................................ 134/6
See application file for complete search history.

(56) References Cited

FOREIGN PATENT DOCUMENTS

| JP | 2013247292 A | 12/2013 |
| JP | 2014060348 A | 4/2014 |

*Primary Examiner* — Eric Golightly
(74) *Attorney, Agent, or Firm* — Nath, Goldberg & Meyer; Jerald L. Meyer

(57) ABSTRACT

A cleaning method that peels off an overlapped substrate and cleans a bonding surface of a peeled substrate to be processed, the overlapped substrate including the substrate to be processed and a support substrate bonded together with a protectant, a peeling agent and an adhesive stacked in order therebetween from the substrate to be processed, the cleaning method comprising: removing the protectant by supplying a solvent of the protectant from a solvent supply part to the bonding surface of the substrate to be processed; and removing the peeling agent by absorbing the peeling agent, which has been peeled from the bonding surface of the substrate to be processed, using a peeling agent absorption part.

8 Claims, 20 Drawing Sheets

CLEANING DEVICE, PEELING SYSTEM, CLEANING METHOD AND COMPUTER-READABLE STORAGE MEDIUM

CROSS-REFERENCE TO RELATED APPLICATION

This application claims the benefit of Japanese Patent Application No. 2014-094581, filed on May 1, 2014, in the Japan Patent Office, the disclosure of which is incorporated herein in its entirety by reference.

TECHNICAL FIELD

The present disclosure relates to a cleaning device, a peeling system including the cleaning device, a cleaning method using the cleaning device, and computer-readable storage medium. The cleaning device peels off an overlapped substrate where a substrate to be processed and a support substrate are bonded with a protectant, peeling agent and adhesive interposed therebetween in this order from a side of the substrate to be processed, and then cleans a bonding surface of the peeled substrate to be processed.

BACKGROUND

Recently, in a manufacturing process of semiconductor devices, for example, an increase in diameter and decrease in thickness of semiconductor substrates, such as silicon wafers, compound semiconductor wafers or the like, are in progress. A plurality of electric circuits is formed on a semiconductor substrate, which will be hereinafter referred to as a substrate to be processed. When transferring or polishing a large and thin substrate to be processed, it is likely that the substrate to be processed is bent or broken. For this reason, a substrate to be processed is reinforced by bonding a support substrate thereto, the reinforced substrate to be processed is transferred or polished, and then the support substrate is peeled off from the substrate to be processed.

Between the substrate to be processed and the support substrate which are bonded together, an adhesive for bonding the substrate to be processed and the support substrate, a peeling agent for smoothly peeling the substrate to be processed and the support substrate, and a protectant for protecting electric circuits formed in the substrate to be processed are stacked, for example.

A peeling system that performs peeling of the substrate to be processed and the support substrate may include a peeling device for peeling the substrate to be processed and the support substrate and a cleaning device for cleaning a bonding surface of the substrate to be processed which is peeled by the peeling device. In the cleaning device, the substrate to be processed is supported and rotated by a substrate support part while a solvent of the adhesive is supplied onto the substrate to be processed, whereby the bonding surface of the substrate to be processed is cleaned.

In this regard, the protectant, the peeling agent, and the adhesive are stacked between the aforementioned substrate to be processed and the support substrate, in this order from the side of the substrate to be processed. Throughout an investigation made by the inventors, it was confirmed that the aforementioned substrate to be processed and support substrate are peeled off at an interface between the peeling agent and the adhesive. As a result, the protectant and the peeling agent remain on the substrate to be processed which has been peeled, and are then removed when the substrate to be processed is cleaned.

However, although the aforementioned peeling system peels off the substrate to be processed and the support substrate which are bonded by the adhesive, it does not consider that, in addition to the adhesive, the protectant and the peeling agent are stacked between the substrate to be processed and the support substrate. That is to say, in the cleaning device of the aforementioned peeling system, the adhesive on the substrate to be processed is removed by supplying the solvent of the adhesive on the substrate to be processed. However, since removing the protectant and the peeling agent is not considered as described above, in some cases, the aforementioned peeling system cannot properly clean the bonding surface of the substrate to be processed. Further, if the protectant and the adhesive are different materials, for example, it takes a long time to remove the protectant and the adhesive using the aforementioned peeling system.

SUMMARY

The present disclosure properly and efficiently cleans a bonding surface of a substrate to be processed which has been peeled off from a support substrate.

According to a first embodiment of the present disclosure, there is provided a cleaning device that peels off an overlapped substrate and cleans a bonding surface of a peeled substrate to be processed, the overlapped substrate including the substrate to be processed and a support substrate bonded together with a protectant, a peeling agent and an adhesive stacked in order therebetween from the substrate to be processed. The cleaning device includes: a support part that supports the substrate to be processed; a solvent supply part that supplies a solvent of the protectant to the bonding surface of the substrate to be processed supported by the support part; and a peeling agent absorption part that absorbs and removes the peeling agent which has been peeled from the bonding surface of the substrate to be processed According to a second embodiment of the present disclosure, there is provided a peeling system including the cleaning device of the first embodiment. The peeling system includes: a first processing block that performs a process with respect to the overlapped substrate and the substrate to be processed; and a second processing block that performs a process with respect to the support substrate. The first processing block includes: a loading/unloading station where the overlapped substrate and the substrate to be processed is mounted; a peeling station that includes a peeling device which peels the overlapped substrate into the substrate to be processed and the support substrate; a cleaning station that includes the cleaning device; and first transfer region that includes a first transfer device which transfers the overlapped substrate and the substrate to be processed between the loading/unloading station, the peeling station and the cleaning station. The second processing block includes: a unloading station where the support substrate is mounted; and a second transfer region that includes a second transfer device which transfers the support substrate with respect to the unloading station According to a third embodiment of the present disclosure, there is provided a cleaning method that peels off an overlapped substrate and cleans a bonding surface of a peeled substrate to be processed, the overlapped substrate including the substrate to be processed and a support substrate bonded together with a protectant, a peeling agent and an adhesive stacked in order therebetween from the substrate to be processed. The cleaning method includes: removing the protectant by supplying a solvent of the protectant from a solvent supply part to the bonding surface of the substrate to be processed; and removing the peeling agent by absorbing the peeling agent, which has been peeled from the bonding surface of the substrate to be processed, using a peeling agent absorption part.

According to a fourth embodiment of the present disclosure, there is provided a non-transitory computer-readable storage medium storing a program which, when executed by a computer of a controller that controls a cleaning device, performs the cleaning method of the third embodiment in the cleaning device.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<1. Peeling System>

Figure 1:
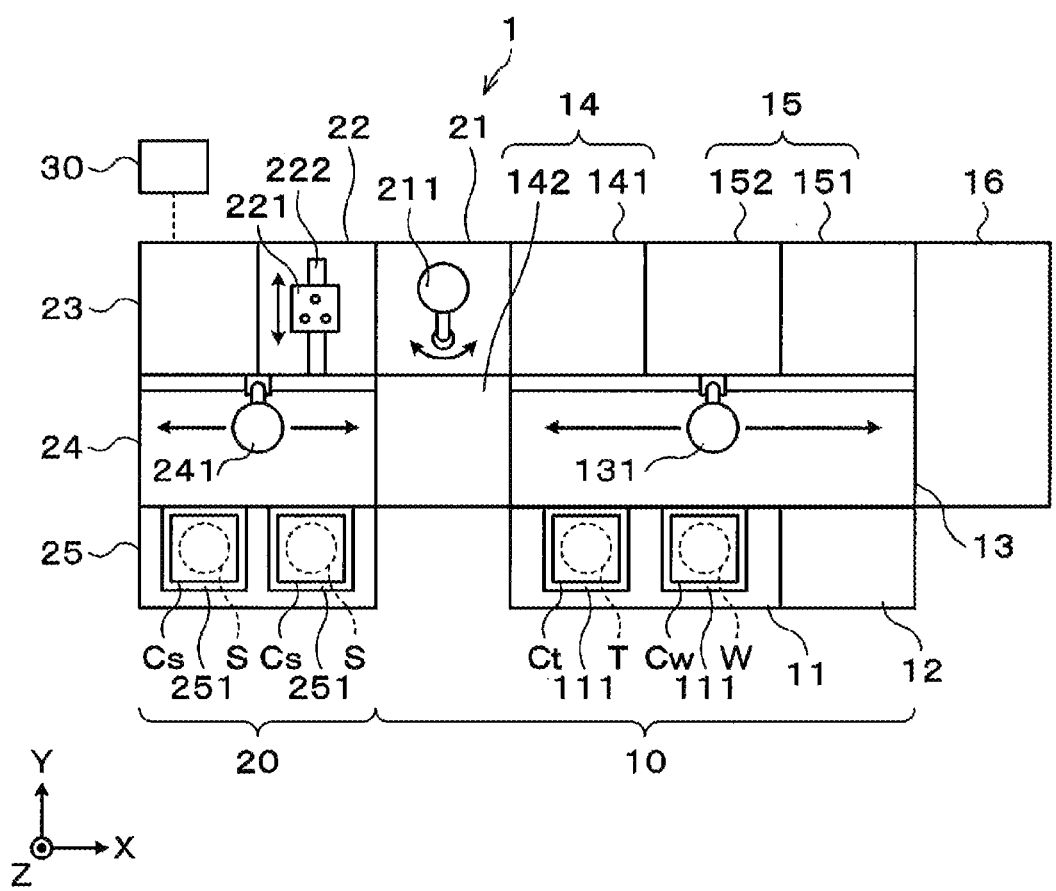
FIG. 1 is a schematic plan view illustrating a configuration of a peeling system according to an embodiment of the present disclosure.
Figure 2:
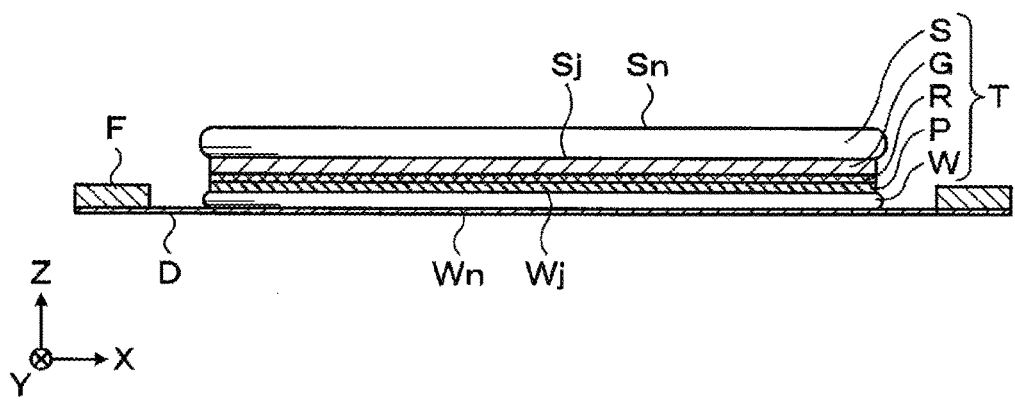
FIG. 2 is a schematic side view of an overlapped substrate supported by a dicing frame.
Figure 3:
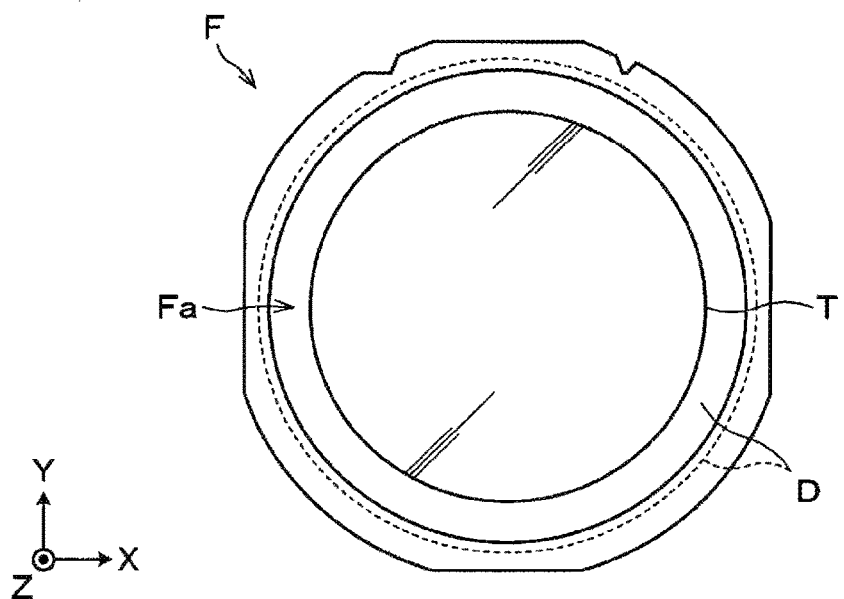
FIG. 3 is a schematic plan view of the overlapped substrate supported by the dicing frame.

First, a configuration of a peeling system according to the present embodiment will be explained with reference to FIGS. 1 to 3. FIG. 1 is a schematic plan view illustrating a configuration of a peeling system according to the present embodiment. FIG. 2 is a schematic side view of an overlapped substrate supported by a dicing frame. FIG. 3 is a schematic plan view of the overlapped substrate.

In the present disclosure, in order to clarify positional relationship, the x-axis, the y-axis, and the z-axis are defined to be orthogonal to one another, and the positive direction of the z-axis is defined as a vertically-upward direction.

A peeling system 1 illustrated in FIG. 1 according to the present embodiment peels off an overlapped substrate T, in which a substrate to be processed W and a support substrate S are bonded with a protectant P, a peeling agent R and an adhesive G interposed therebetween (see FIG. 2), into the substrate to be processed W and the support substrate S.

Hereinafter, as illustrated in FIG. 2, one of both plate surfaces of the substrate to be processed W at a side bonded to the support substrate S with the protectant P, the peeling agent R and the adhesive G interposed therebetween will be referred to as a "bonding surface Wj", and the other plate surface at the reverse side of the bonding surface Wj will be referred to as a "non-bonding surface Wn". Moreover, one of both plate surfaces of the support substrate S at a side bonded to the substrate to be processed W with the protectant P, the peeling agent R and the adhesive G interposed therebetween will be referred to as a "bonding surface Sj", and the other plate surface at the reverse side of the bonding surface Sj will be referred to as a "non-bonding surface Sn".

The substrate to be processed W is a substrate where a plurality of electric circuits is formed on a semiconductor substrate, for example, a silicon wafer, a compound semiconductor wafer and so forth. The plate surface where the electric circuits are formed is the bonding surface Wj. The substrate to be processed W is thinned by, for example, polishing the non-bonding surface Wn. Specifically, a thickness of the substrate to be processed W ranges from 20 to 50 μm.

The support substrate S has a diameter that is approximately the same as the substrate to be processed W and supports the substrate to be processed W. The thickness of the support substrate S ranges from 650 to 750 μm. As well as a silicon wafer, a glass substrate may be used as the support substrate S.

Between the substrate to be processed W and the support substrate S, the protectant P, the peeling agent R and the adhesive G are stacked in this order from the side of the substrate to be processed W. The protectant P is formed to protect the electric circuits formed on the bonding surface Wj of the substrate to be processed W. The peeling agent R is formed to smoothly peel off the substrate to be processed W and the support substrate S. The adhesive G is formed to bond the substrate to be processed W and the support substrate S.

As illustrated in FIG. 3, the overlapped substrate T is fixed to a dicing frame F. The dicing frame F is a substantially circular member having an opening portion Fa in the center thereof, wherein the diameter of the opening portion Fa is larger than that of the overlapped substrate T. The dicing frame F is made of metal such as stainless steel or the like. A thickness of the dicing frame F is approximately 1 mm, for example.

The overlapped substrate T is fixed to the dicing frame F with a dicing tape D interposed therebetween. Specifically, under a state where the overlapped substrate T is arranged in the opening portion Fa of the dicing frame F, the dicing tape D is attached to the non-bonding surface Wn of the substrate to be processed W and a rear surface of the dicing frame F, so that the opening portion Fa is closed by the overlapped substrate T and the dicing tape D from the rear surface of the dicing frame F. Therefore, the overlapped substrate T is fixed (supported) on the dicing frame F.

As illustrated in FIG. 1, the peeling system 1 includes two processing blocks, i.e., a first processing block 10 and a second processing block 20. The second processing block 20 and the first processing block 10 are arranged along the x-axis direction in this order, thereby adjoining each other.

In the first processing block 10, loading of the overlapped substrate T, peeling of the overlapped substrate T, cleaning and unloading of the substrate to be processed W which has been peeled, and so forth are performed. That is to say, the first processing block 10 performs processes with respect to the substrates (the overlapped substrate T and the substrate to be processed W) supported by the dicing frame F. The first processing block 10 includes a loading/unloading station 11, a stand-by station 12, a first transfer region 13, a peeling station 14, a first cleaning station 15, and an edge-cut station 16.

The loading/unloading station 11, the stand-by station 12, the peeling station 14, the first cleaning station 15, and the edge-cut station 16 are arranged to adjoin the first transfer region 13. Specifically, the loading/unloading station 11 and the stand-by station 12 are arranged side-by-side at the negative y-axis direction side of the first transfer region 13. One peeling device 141 of the peeling station 14 and two first cleaning devices 151 and 152 of the first cleaning station 15 are arranged side-by-side at the positive y-axis direction side of the first transfer region 13. Another peeling device 142 of the peeling station 14 is arranged at the negative x-axis direction side of the first transfer region 13, and the edge-cut station 16 is arranged at the positive x-axis direction side of the first transfer region 13.

In the loading/unloading station 11, a plurality of cassette mounting tables 111 is installed. On each of the cassette mounting tables 111, a cassette Ct accommodating the overlapped substrate T or a cassette Cw accommodating the substrate to be processed W which has been peeled is mounted. The cassette Ct and the cassette Cw are loaded into or unloaded from the loading/unloading station 11 between the outside of the peeling system 1.

In the stand-by station 12, for example, an ID reader for reading an ID (identification) of the dicing frame F is arranged, whereby the overlapped substrate T in process is identified by the ID reader. In addition to the ID reading process, the stand-by station 12 performs a stand-by process for temporarily storing the overlapped substrate T waiting a next process in a temporary stand-by part as necessary. In the stand-by station 12, a mounting table where the overlapped substrate T transferred by a below-described first transfer device 131 is mounted is installed. The ID reader and the temporary stand-by part are mounted in the mounting table.

In the first transfer region 13, the first transfer device 131 for transferring the overlapped substrate T or the substrate to be processed W which has been peeled is arranged. The first transfer device 131 includes a transfer arm and a substrate support portion installed in a leading end of the transfer arm. The transfer arm can move in horizontal and vertical directions, and can rotate about a vertical axis. In the first transfer region 13, the first transfer device 131 transfers the overlapped substrate T to the stand-by station 12, the peeling station 14 or the edge-cut station 16, and transfers the substrate to be processed W which has been peeled to the first cleaning station 15 or the loading/unloading station 11.

In the peeling station 14, two of the peeling devices 141 and 142 are arranged. The peeling devices 141 and 142 in the peeling station 14 perform a peeling process in which the overlapped substrate T is peeled off into the substrate to be processed W and the support substrate S. Specifically, the peeling devices 141 and 142 arranges the substrate to be processed W and the support substrate S downward and upward, respectively, and peels off the overlapped substrate T into the substrate to be processed W and the support substrate S. As the peeling devices 141 and 142, a peeling device disclosed in Japanese Patent Laid-open No. 2014-060348, for example, may be used. The number of peeling devices arranged in the peeling station 14 is not limited to the present embodiment, but can be set arbitrarily. Further, although the peeling devices 141 and 142 are arranged side-by-side along the horizontal direction in the present embodiment, the peeling devices 141 and 142 may be stacked in the vertical direction.

In the first cleaning station 15, two of the first cleaning devices 151 and 152 are arranged. The first cleaning devices 151 and 152 in the first cleaning station 15 perform a cleaning process for cleaning the bonding surface Wj of the substrate to be processed W while the substrate to be processed W which has been peeled is supported by the dicing frame F. The number of cleaning devices arranged in the first cleaning station 15 is not limited to the present embodiment, but can be set arbitrarily. Further, although the first cleaning devices 151 and 152 are arranged side-by-side along the horizontal direction in the present embodiment, the cleaning devices 151 and 152 can be stacked in the vertical direction.

In the edge-cut station 16, an edge-cut device is arranged. The edge-cut device performs an edge-cut process in which a peripheral portion of the adhesive G in the overlapped substrate T is dissolved and removed using a solvent. By removing the peripheral portion of the adhesive G through the edge-cut process, the substrate to be processed W and the support substrate S can be easily peeled off in a peeling process to be described. The edge-cut device dissolves the peripheral portion of the adhesive G using the solvent of the adhesive G, for example, by immersing the overlapped substrate T in the solvent.

In the second processing block 20, the peeled support substrate S is cleaned and unloaded. That is to say, the second processing block 20 performs a process with respect to a substrate (the support substrate S) which is not supported by the dicing frame F. The second processing block 20 includes a first transfer station 21, a second transfer station 22, a second cleaning station 23, a second transfer region 24, and an unloading station 25.

The first transfer station 21 is arranged at the negative x-axis direction side of the peeling device 141 of the peeling station 14 and at the positive y-axis direction side of the peeling device 142. Moreover, the second transfer station 22, the second cleaning station 23, and the unloading station 25 are arranged to adjoin the second transfer region 24. Specifically, the second transfer station 22 and the second cleaning station 23 are arranged side-by-side at the positive y-axis direction side of the second transfer region 24, and the unloading station 25 is arranged at the negative y-axis direction side of the second transfer region 24.

The first transfer station 21 receives the support substrate S which has been peeled from the peeling devices 141 and 142 of the peeling station 14 and transfers the received support substrate S to the second transfer station 22. In the first transfer station 21, a transfer device 211 is arranged. The transfer device 211 includes a non-contact support portion, for example, a Bernoulli chuck or the like, which is configured to be rotatable about the horizontal axis. Specifically, as the transfer device 211, a transfer device disclosed in Japanese Patent Laid-open No. 2014-060348, for example, may be used. The transfer device 211 transfers the support substrate S from the peeling devices 141 and 142 to the second processing block 20 in a non-contact manner, while reversing the front and rear surfaces of the support substrate S which has been peeled.

In the second transfer station 22, a mounting portion 221 for mounting the support substrate S and a moving portion 222 for moving the mounting portion 221 in the y-axis direction are arranged. The mounting portion 221 includes, for example, three support pins, and supports and mounts the non-bonding surface Sn of the support substrate S. The moving portion 222 includes a rail extending in the y-axis direction and a driving portion for moving the mounting portion 221 in the y-axis direction. In the second transfer station 22, the support substrate S is mounted on the mounting portion 221 by the transfer device 211 of the first transfer station 21, and then the mounting portion 221 is moved toward the second transfer region 24 by the moving portion 222. Then, the support substrate S is transferred from the mounting portion 221 to a second transfer device 241 (to be described later) of the second transfer region 24. In the present embodiment, the mounting portion 221 moves in the y-axis direction only, but may be configured to move in the x-axis and y-axis directions.

Since the aforementioned transfer device 211 of the first transfer station 21 supports the support substrate S by the non-contact support portion such as the Bernoulli chuck or the like, it does not show high transfer reliability. For this reason, if the support substrate S is directly transferred to the second transfer device 241 (to be described later) of second transfer region 24 by the transfer device 211, it is likely that the support substrate S is dropped during the transfer. Therefore, in the present embodiment, the second transfer station 22 is installed between the first transfer station 21 and the second transfer region 24, and the support substrate S is first mounted in the second transfer station 22.

In the second cleaning station 23, a second cleaning device for cleaning the bonding surface Sj of the support substrate S which has been peeled is arranged. As the second cleaning device, a cleaning device disclosed in Japanese Patent Laid-open No. 2014-060348, for example, may be used.

In the second transfer region 24, the second transfer device 241 for transferring the support substrate S which has been peeled is arranged. The second transfer device 241 includes a transfer arm and a substrate support portion installed in a leading end of the transfer arm. The transfer arm can move in the horizontal and vertical directions, and can rotate about a vertical axis. In the second transfer region 24, the second transfer device 241 transfers the support substrate S which has been peeled to the unloading station 25.

In the unloading station 25, a plurality of cassette mounting tables 251 is installed. On each of the mounting tables 251, a cassette Cs accommodating the support substrate S which has been peeled is mounted. The cassette Cs is unloaded from the unloading station 25 to the outside of the peeling system 1.

The peeling system 1 further includes a controller 30 that controls operation of the peeling system 1. The controller 30 is, for example, a computer and includes a control part and a storage part (not illustrated). In the storage part, programs for controlling a variety of processes, such as the peeling process and the like, are stored. The control part reads and executes the programs stored in the storage part, thereby controlling the operation of the peeling system 1.

The programs may be stored in a non-transitory computer-readable storage medium and installed in the storage part of the controller 30 from the non-transitory computer-readable storage medium. The non-transitory computer-readable storage medium can be, for example, a hard-disk (HD), a flexible disk (FD), a compact disk (CD), a magnet optical (MO) disk or a memory card.

Figure 4:
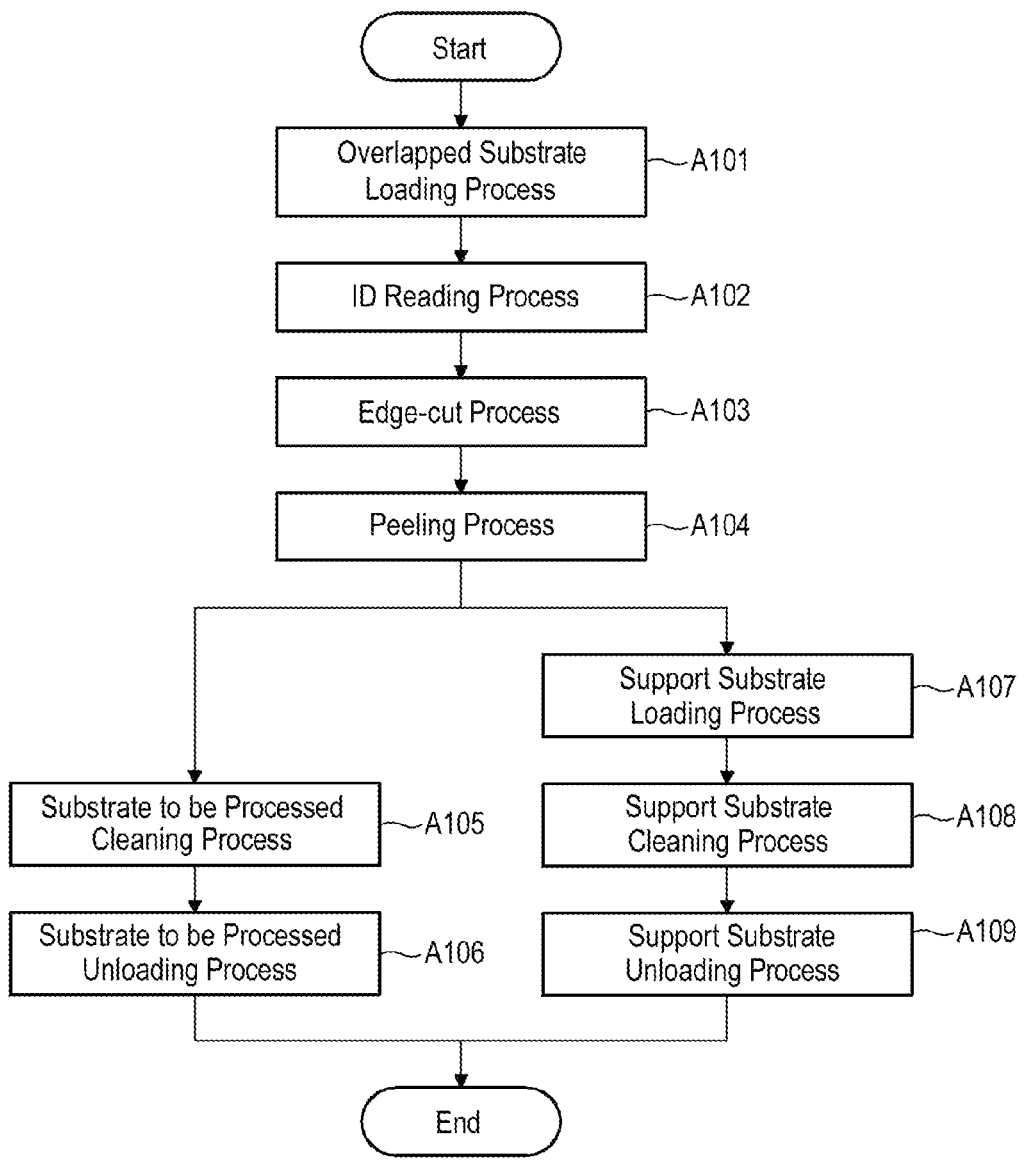
FIG. 4 is a flowchart illustrating a sequence of a peeling process conducted by the peeling system.

Next, a peeling process in which the substrate to be processed W and the support substrate S are peeled off by using the peeling system 1 configured as described above will be explained. FIG. 4 is a flowchart illustrating an example of main steps of the peeling process. The peeling system 1 performs each of the process sequences illustrated in FIG. 4 under a control of the controller 30.

First, the cassette Ct accommodating a plurality of the overlapped substrates T and an empty cassette Cw are mounted on the predetermined cassette mounting tables 111 of the loading/unloading station 11, and empty cassettes Cs are mounted on the predetermined cassette mounting tables 251 of the unloading station 25. In the peeling system 1, the first transfer device 131 of the first processing block 10 takes out the overlapped substrate T from the cassette Ct mounted in the loading/unloading station 11. At this time, under a state where the substrate to be processed W is positioned downward and the support substrate S is positioned upward, the overlapped substrate T is supported from above by the substrate support portion of the first transfer device 131. Then, the first transfer device 131 performs a substrate loading process for loading the overlapped substrate T taken out from the cassette Ct into the stand-by station 12 (Step A101 in FIG. 4).

Next, in the stand-by station 12, the ID reader performs an ID reading process for reading an ID of the dicing frame F (Step A102 in FIG. 4). The ID read by the ID reader is transmitted to the controller 30. Thereafter, the overlapped substrate T is taken out from the stand-by station 12 and transferred to the edge-cut station 16 by the first transfer device 131.

In the edge-cut station 16, the edge-cut device performs an edge-cut process with respect to the overlapped substrate T (Step A103 in FIG. 4). The peripheral portion of the adhesive G is removed by the edge-cut process, which makes it easier to peel off the substrate to be processed W and the support substrate S in a subsequent peeling process. Therefore, a peeling process time can be reduced.

In the peeling system 1 according to the present embodiment, since the edge-cut station 16 is embedded in the first processing block 10 as described above, the overlapped substrate T loaded into the first processing block 10 can be directly loaded into the edge-cut station 16 by using the first transfer device 131. Therefore, throughput of a series of the peeling process can be improved. Moreover, a time from the edge-cut process to the peeling process can be easily managed, whereby peeling performance can be stabilized.

Moreover, if the overlapped substrate T is required to wait for a next process due to a difference in process times among devices, the overlapped substrate T can be temporarily stored in the temporary stand-by part installed in the stand-by station 12, whereby time loss between a series of the processes can be reduced.

Next, the overlapped substrate T which has been subjected to the edge-cut process is taken out from the edge-cut station 16 and loaded into the peeling device 141 of the peeling station 14 by the first transfer device 131. In the peeling station 14, the peeling device 141 performs the peeling process with respect to the overlapped substrate T (Step A104 in FIG. 4). The overlapped substrate T is peeled off into the substrate to be processed W and the support substrate S by the peeling process. At this time, the overlapped substrate T is peeled off into the substrate to be processed W and the support substrate S at an interface between the peeling agent R and the adhesive G. This is because adhesive strength between the support substrate S and the adhesive G is stronger than adhesive strength between the peeling agent R and the adhesive G. After the peeling, the protectant P and the peeling agent R remain in the bonding surface Wj of the substrate to be processed W and the adhesive G remains in the bonding surface Sj of the support substrate S.

Thereafter, in the peeling system 1, a process with respect to the substrate to be processed W which has been peeled and a process with respect to the support substrate S which has been peeled are performed in the first processing block 10 and the second processing block 20, respectively. The substrate to be processed which has been peeled is supported by the dicing frame F.

In the first processing block 10, the substrate to be processed W which has been peeled is taken out from the peeling device 141 of the peeling station 14 and loaded into the first cleaning device 151 of the first cleaning station 15 by the first transfer device 131. In the first cleaning station 15, the first cleaning device 151 performs a cleaning process with respect to the substrate to be processed W which has been peeled (Step A105 in FIG. 4). The protectant P and the peeling agent R remaining in the bonding surface Wj of the substrate to be processed W are removed by the cleaning process.

The substrate to be processed W after the cleaning process is taken out from the first cleaning device 151 of the first cleaning station 15 by the first transfer device 131 and is accommodated in the cassette Cw mounted in the loading/unloading station 11. Thereafter, the cassette Cw accommodating a plurality of the substrates to be processed W is taken out from the loading/unloading station 11 and is then collected (Step A106 in FIG. 4). In this way, the process with respect to the substrate to be processed W is completed.

Meanwhile, in the second processing block 20, processes (Steps A107 to A109 to be described below) with respect to the support substrate S which has been peeled is performed in parallel with the processes of Steps A105 and A106.

In the second processing block 20, first, the transfer device 211 of the first transfer station 21 performs a transfer process of the support substrate S which has been peeled. Specifically, the transfer device 211 takes out the support substrate S which has been peeled from the peeling device 141 of the peeling station 14 and loads the same into the second transfer station 22 (Step A107 in FIG. 4).

Here, an upper surface side of the support substrate S which has been peeled, i.e., a side of the non-bonding surface Sn, is supported by the peeling device 141, and the bonding surface Sj of the support substrate S is supported by the transfer device 211 from below in a non-contact manner. Subsequently, the transfer device 211 reverses the supported support substrate S, and then mounts the support substrate S on the mounting portion 221 of the second transfer station 22, whereby the support substrate S is mounted on the mounting portion 221 with the bonding surface Sj facing upward.

In the second transfer station 22, the moving portion 222 moves the mounting portion 221 on which the support substrate S is mounted to a predetermined position at a side of the second transfer region 24. The predetermined position is a position where the transfer arm of the second transfer device 241 can receive the support substrate S mounted on the mounting portion 221.

Next, the support substrate S is taken out from the second transfer station 22 and loaded into the second cleaning station 23 by the second transfer device 241. In the second cleaning station 23, the second cleaning device performs a cleaning process with respect to the support substrate S which has been peeled (Step A108 in FIG. 4). The adhesive G remaining in the bonding surface Sj of the support substrate S is removed by this cleaning process.

The support substrate S after the cleaning process is taken out from the second cleaning station 23 by the second transfer device 241 and is accommodated in the cassette Cs mounted in the unloading station 25. Thereafter, the cassette Cs accommodating a plurality of the support substrates S is taken out from the unloading station 25 and is then collected (Step A109 in FIG. 4). In this way, the process with respect to the support substrate S is completed.

As described above, the peeling system 1 according to the present embodiment includes the first processing block 10 that processes the overlapped substrate T and the substrate to be processed W and the second processing block 20 that processes the support substrate S. Therefore, since processes with respect to the overlapped substrate T and the substrate to be processed W and processes with respect to the support substrate S can be performed in parallel, a series of substrate processing can be performed efficiently. More specifically, the peeling system 1 according to the present embodiment includes a front-end (the loading/unloading station 11 and the first transfer region 13) for a substrate which is supported by the dicing frame F (the overlapped substrate T and the substrate to be processed W which has been peeled) and a front end (the unloading station 25 and the second transfer region 24) for a substrate which is not supported by the dicing frame F (the support substrate S which has been peeled). In this way, transfer of the substrate to be processed W to the loading/unloading station 11 and transfer of the support substrate S to the unloading station 25 can be performed in parallel. Therefore, a stand-by time for substrate transfer can be reduced, which improves throughput of the peeling process.

Moreover, according to the present embodiment, although the overlapped substrate T and the substrate to be processed W are supported by the dicing frame F, the transfer of the overlapped substrate T and the substrate to be processed W which are supported by the dicing frame F and the transfer of the support substrate S which is not supported by the dicing frame are performed by separate devices of the first transfer device 131 and the second transfer device 241, respectively. Therefore, in the present embodiment, control of transferring the overlapped substrate T, the substrate to be processed W and the support substrate S can be simplified in comparison with a conventional method wherein a single transfer device transfers both the substrates supported by a dicing frame and the substrates which are not supported in the dicing frame, whereby the peeling process can be conducted efficiently.

In the peeling system 1 according to the present embodiment, the peeling station 14, the second cleaning station 23 and the second transfer region 24 are connected through the first transfer station 21 and the second transfer station 22. Therefore, the support substrate S can be directly loaded from the peeling station 14 into the second transfer region 24 without passing through the first transfer region 13, whereby the transfer of the support substrate S which has been peeled can be smoothly performed.

Further, the second transfer station 22 includes the mounting portion 221 for mounting the support substrate S and the moving portion 222 for moving the mounting portion 221 in the horizontal direction. With this configuration, since the mounting portion 221 mounting the support substrate S can move when the support substrate S is transferred between the first transfer station 21 and the second transfer station 24, it is not necessary to extend the non-contact support portion of the transfer device 211 of the first transfer station 21 or the transfer arm of the second transfer device 241 of the second transfer region 24. Therefore, footprints of the first transfer station 21 and the second transfer region can be reduced, whereby the overall footprint of the peeling system 1 can be reduced.

In the aforementioned peeling system 1, the first processing block 10 may include a mounting device for attaching the dicing frame F to the overlapped substrate T. In this case, the overlapped substrate T to which no dicing frame F is attached is taken out from the cassette Ct and loaded into the mounting device, the dicing frame F is attached to the overlapped substrate T in the mounting device, and then the overlapped substrate T fixed to the dicing frame F is transferred to the peeling station 14. The mounting device may be arranged at an arbitrary position in the first processing block 10.

The first cleaning station 15 and the edge-cut station 16 installed in the first processing block 10 of the peeling system 1 may be installed outside of the peeling system 1. Also, the second cleaning station 23 installed in the second processing block 20 may be installed outside of the peeling system.

In the aforementioned peeling system 1, the processing devices or transfer areas in the respective processing station may be arranged arbitrarily, for example, arranged side-by-side in the horizontal direction or stacked in the vertical direction.

<2. Configuration of First Cleaning Device>

Figure 5:
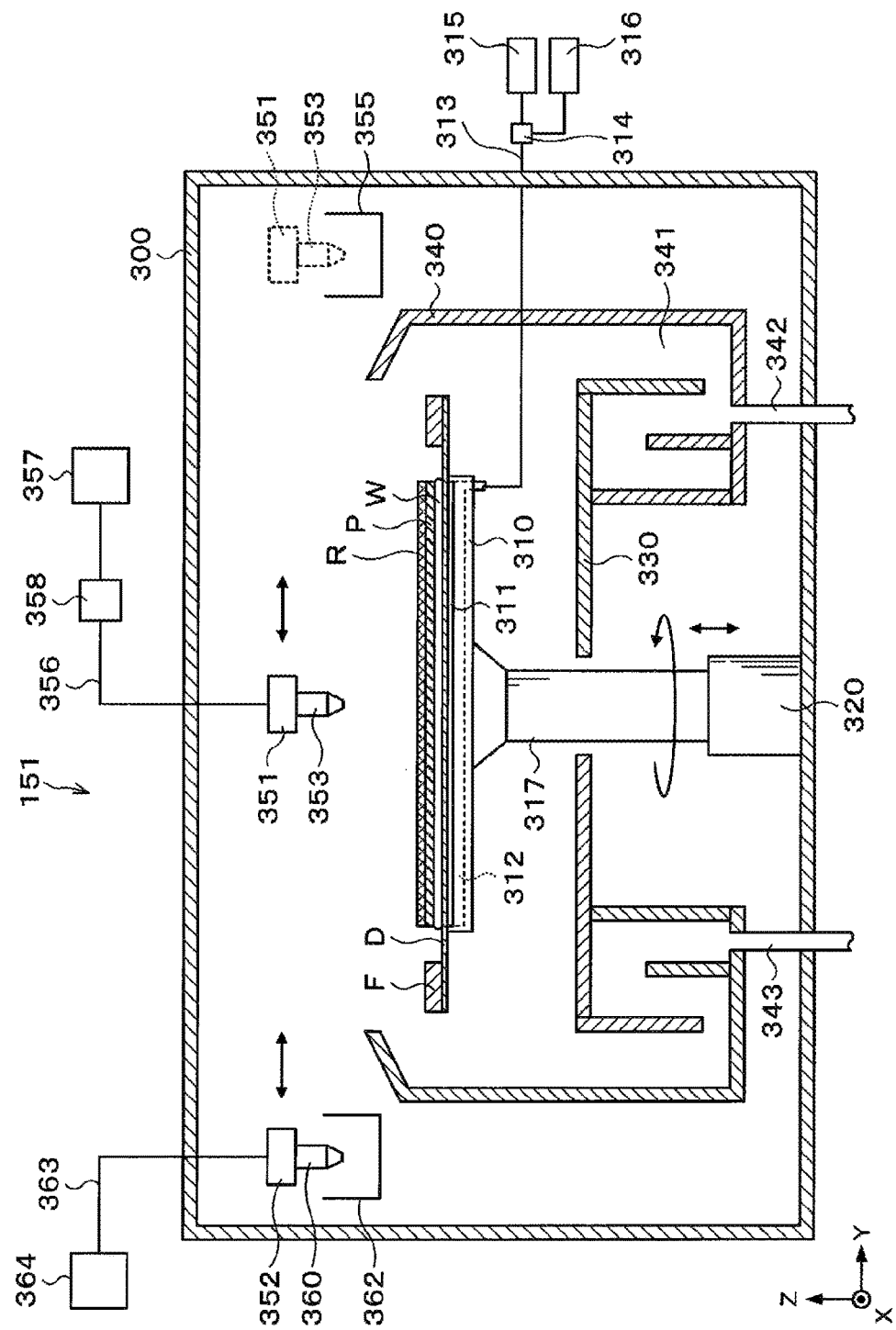
FIG. 5 is a vertical sectional view schematically illustrating a configuration of a first cleaning device.
Figure 6:
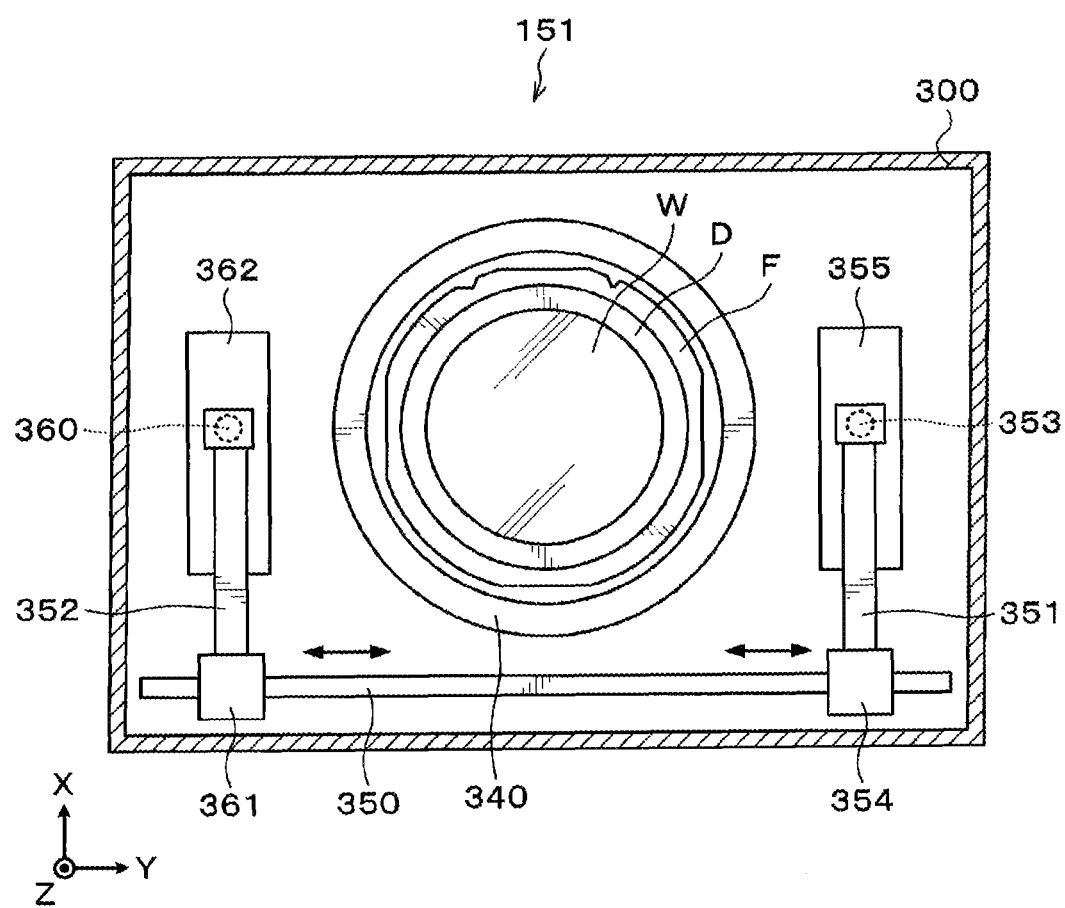
FIG. 6 is a horizontal sectional view schematically illustrating the configuration of the first cleaning device.

Hereinafter, configuration of the first cleaning devices 151 and 152 installed in the first cleaning station 15 will be explained with reference to FIGS. 5 and 6. FIG. 5 is a vertical sectional view schematically illustrating a configuration of the first cleaning device 151. FIG. 6 is a horizontal sectional view schematically illustrating the configuration of the first cleaning device 151. Since the first cleaning device 152 has the same configuration with the first cleaning device 151, configuration of the first cleaning device 152 will be omitted.

As illustrated in the FIG. 5, the first cleaning device 151 includes a process container 300. In a side surface of the process container 300, a loading/unloading gate (not illustrated) of the substrate to be processed W is formed. In the loading/unloading gate, an opening/closing shutter (not illustrated) is installed.

At the central portion in the process container 300, a support part 310 for supporting and rotating the substrate to be processed W is installed. As the support part 310, a porous chuck, for example, is used. The support part 310 is made of metal such as aluminum or the like.

In the front surface of the support part 310, an adsorption surface 311 is formed. The adsorption surface 311 has approximately the same diameter with the substrate to be processed W and makes contact with the non-bonding surface Wn of the substrate to be processed W. The adsorption surface 311 is made of, for example, porous material such as silicon carbide or porous ceramic.

In the support part 310, an absorption space 312 communicating with the outside through the adsorption surface 311 is formed. A pipe 313 is connected to the absorption space 312. The pipe 313 branches into two pipes at a valve 314. One branch of the pipe 313 is connected to an intake device 315, for example, a vacuum pump or the like. In the intake device 315, a sensor (not illustrated) is installed to measure an intake pressure, i.e., an absorption pressure when the substrate to be processed W is absorbed by the support part 310. The other branch of the pipe 313 is connected to a gas supply source 316 in which nitrogen gas or air, for example, is stored.

The support part 310 adsorbs the non-bonding surface Wn of the substrate to be processed W onto the adsorption surface 311 with the dicing tape D interposed therebetween by using a negative pressure generated by an air intake of the intake device 315, whereby the support part 310 supports the substrate to be processed W. Alternatively, the support part 310 may support the substrate to be processed W with the substrate to be processed W floated by discharging a gas from the front surface of the support part 310. Further, although the support part 310 is a porous chuck in the present embodiment, the support part 310 may be, for example, an electrostatic chuck.

Below the support part 310, a rotary mechanism 320 is installed with a support member 317 interposed therebetween. The rotary mechanism 320 includes a driving part, for example, a motor or the like, and rotates the support part 310 about a vertical axis. In addition, an elevation driving part, for example, a cylinder or the like, is installed in the rotary mechanism 320 to move the support part 310 vertically.

Also, below the support part 310, an annular guide ring 330 is installed to surround the support member 317. The peripheral portion of the guide ring 330 is bent to extend downwards. A cup 340 is installed to surround the support part 310 and the guide ring 330, so that objects scattered or falling down from the substrate to be processed W are received and collected by the cup 340.

An opening having a diameter larger than that of the dicing frame F is formed in the upper surface of the cup 340, and a gap 341 forming a discharge passage is formed between a circumferential surface of the cup 340 and a peripheral portion of the guide ring 330. The lower part of the cup 340 together with the peripheral portion of the guide ring 330 forms a bent passage that constitutes a gas-liquid separation part.

A drain pipe 342 for draining a liquid collected into the cup 340 is connected to the outer region of the gas-liquid separation part formed in the lower part of the cup 340. The drain pipe 342 communicates with a waste liquid container (not illustrate) for storing the collected waste liquid.

In addition, an exhaust pipe 343 for exhausting an inner atmosphere of the cup 340 is connected to the inner region of the gas-liquid separation part formed in the lower part of the cup 340. The exhaust pipe 343 communicates with a negative pressure generating device (not illustrated), for example, a vacuum pump or the like.

As illustrated in FIG. 6, a rail 350 extending along the y-axis direction (the left and right direction in FIG. 6) is installed in the negative x-axis direction side (the downward direction side in FIG. 6) of the cup 340. The rail 350 extends, for example, from the outside of the cup 340 in the negative y-axis direction (the left direction in FIG. 6) to the outside of the cup 340 in the positive y-axis direction (the right direction in FIG. 6). Two arms 351 and 352, for example, are installed in the rail 350.

The first arm 351, as illustrated in FIGS. 5 and 6, supports a solvent nozzle 353 as a solvent supply part for supplying a solvent of the protectant P. The first arm 351 can move along the rail 350 by a nozzle driving part 354 illustrated in FIG. 6. With this configuration, the solvent nozzle 353 can move above the substrate to be processed W disposed in the cup 340 in a radial direction of the substrate to be processed W, from a stand-by part 355 installed at the outside of the cup 340 in the positive y-axis direction. Also, the first arm 351 can move vertically by the nozzle driving part 354, whereby the height of the solvent nozzle 353 can be adjusted.

As illustrated in FIG. 5, the solvent nozzle 353 is connected to a supply pipe 356 for supplying the solvent of the protectant P to the solvent nozzle 353. The supply pipe 356 communicates with a solvent supply source 357 in which the solvent of the protectant P is stored. In addition, in the supply pipe 356, a supply mechanism group 358 including a valve, a flow rate controller and the like that control flow of the solvent of the protectant P is installed.

The second arm 352 supports an absorption nozzle 360 as a peeling agent absorption part for absorbing the peeling agent R peeled from the bonding surface Wj of the substrate to be processed W. The second arm 352 can move along the rail 350 by a nozzle driving part 361 as a moving mechanism illustrated in FIG. 6. With this configuration, the absorption nozzle 360 can move above the substrate to be processed W disposed in the cup 340 in the radial direction of the substrate to be processed W, from a stand-by part 362 installed at the outside of the cup 340 in the negative y-axis direction. Also, the second arm 352 can move vertically by the nozzle driving part 361, whereby the height of the absorption nozzle 360 can be adjusted.

As illustrated in FIG. 5, the absorption nozzle 360 is connected to an absorption pipe 363 for absorbing the peeling agent R. The absorption pipe 363 communicates with a waste container 364 in which the peeling agent R can be stored. In the waste container 364, a negative pressure generating device (not illustrated), for example, a vacuum pump or the like, is installed. The peeling agent R is collected into the waste container 364 through the absorption pipe 363 by the negative pressure generating device.

Although one absorption nozzle 360 is installed in the first cleaning device 151 of the present embodiment, a plurality of absorption nozzles may be installed. In this case, the peeling agent R can be removed more efficiently.

<3. Operation of First Cleaning Device>

Figure 7:
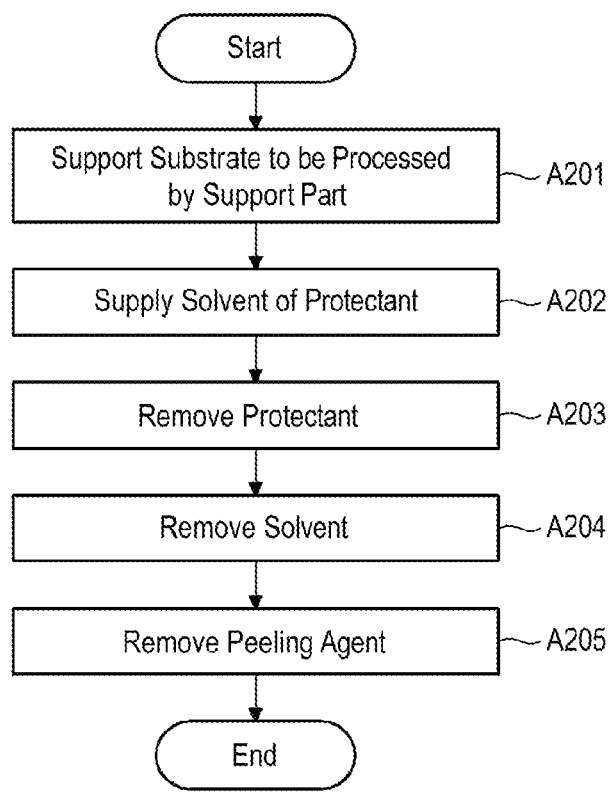
FIG. 7 is a flowchart illustrating main steps of a cleaning process of the first cleaning device.

Hereinafter, a cleaning method of the bonding surface Wj of the substrate to be processed W using the first cleaning device 151 will be explained. FIG. 7 is a flowchart illustrating main steps of the cleaning process. FIGS. 8 to 16 are diagrams for explaining the cleaning process. The first cleaning device 151 performs each of the sequences illustrated in FIG. 7 under the control of the controller 30.

Figure 8:
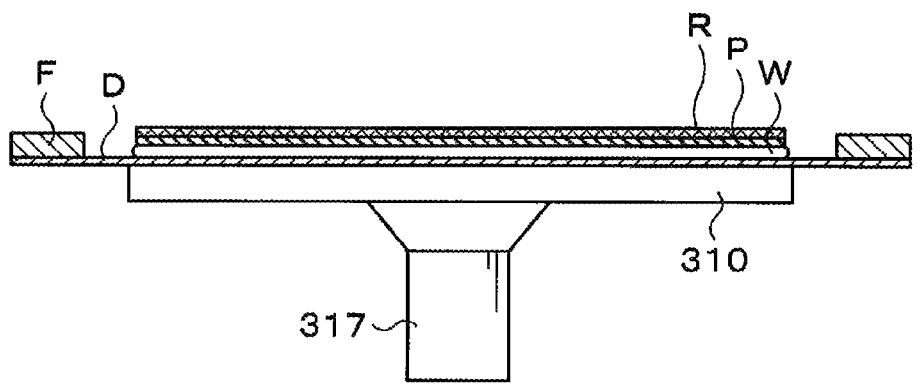
FIGS. 8 to 13 are diagrams for explaining the cleaning process of the first cleaning device.

First, the substrate to be processed W loaded into the first cleaning device 151 by the first transfer device 131 is transferred to and supported by the support part 310 as illustrated in FIG. 8 (Step A201 in FIG. 7).

Figure 9:
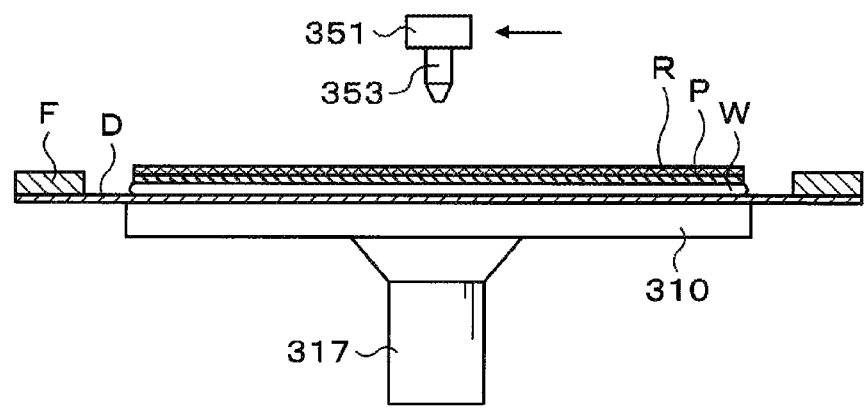
Figure 10:
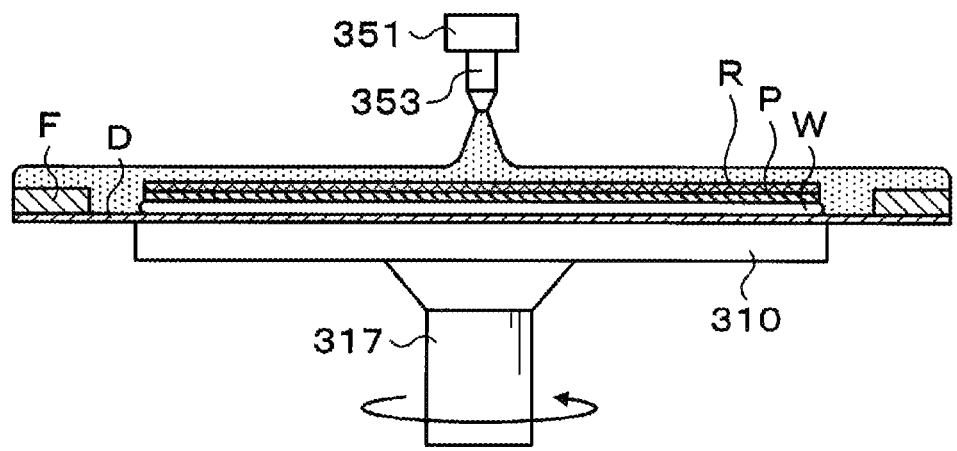

Next, as illustrated in FIG. 9, the solvent nozzle 353 is moved from the stand-by part 355 to above a central portion of the substrate to be processed W by the first arm 351. Thereafter, as illustrated in FIG. 10, a solvent M is supplied from the solvent nozzle 353 to the bonding surface Wj of the substrate to be processed W while the support part 310 (the substrate to be processed W) is rotated by the rotary mechanism 320 (Step A202 in FIG. 7). The supplied solvent M is diffused to the entire bonding surface Wj of the substrate to be processed W by a centrifugal force.

Figure 11:
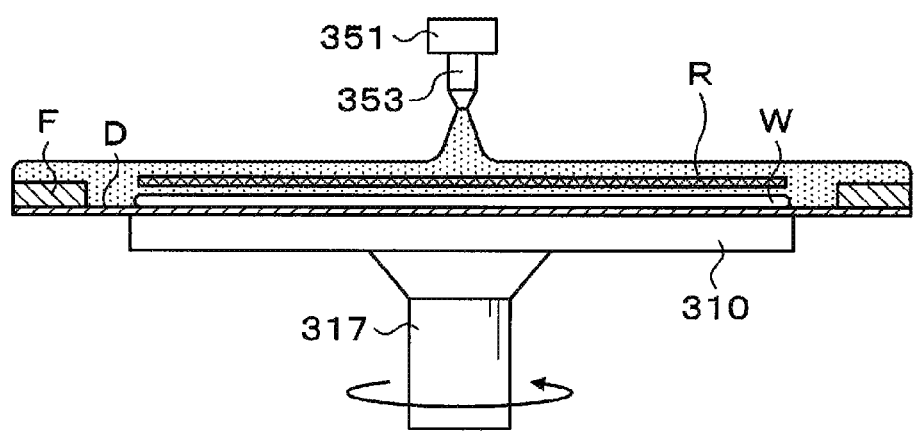

After a lapse of a predetermined time, as illustrated in FIG. 11, the protectant P in the bonding surface Wj of the substrate to be processed W is dissolved and removed by the solvent M (Step A203 in FIG. 7). At this time, if the peeling agent R is not or is hardly dissolved in the solvent M, for example, the peeling agent R floats away from the bonding surface Wj of the substrate to be processed W. In some cases, the peeling agent R together with the protectant P may be dissolved in the solvent M. In those cases, the cleaning process of the bonding surface Wj of the substrate to be processed W is completed by dissolving both the protectant P and the peeling agent R in the solvent M.

When the protectant P is dissolved and removed in Step A203, supplying the solvent M from the solvent nozzle 353 is stopped and the solvent nozzle 353 is moved from above the central portion of the substrate to be processed W to the stand-by part 355 by the first arm 351.

Figure 12:
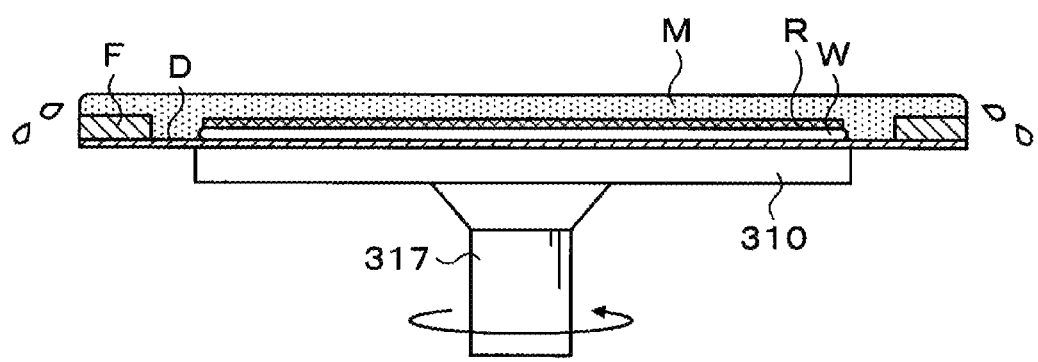

Thereafter, as illustrated in FIG. 12, the support part 310 (the substrate to be processed W) is rotated by the rotary mechanism 320, whereby the solvent M is scattered and removed outside of the bonding surface Wj of the substrate to be processed W by the centrifugal force (Step A204 in FIG. 7). The scattered solvent M is collected into the cup 340 and is then drained from the drain pipe 342. At this time, although the peeling agent R remains in the bonding surface Wj of the substrate to be processed W, the peeling agent R just exists in the bonding surface Wj and is not bonded to the bonding surface Wj.

Figure 13:
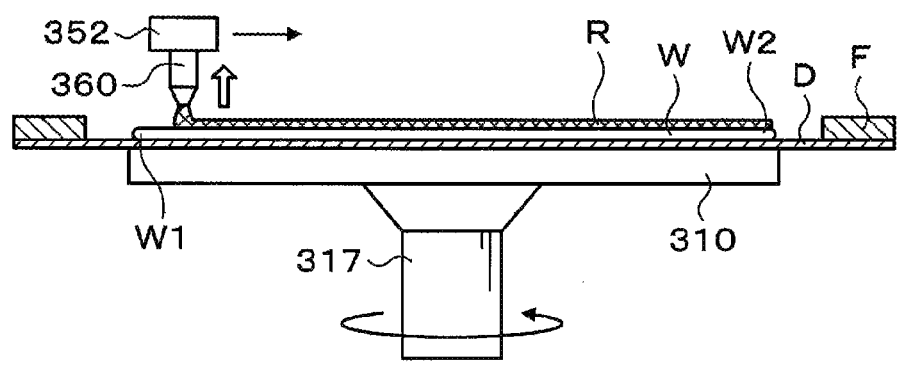

Thereafter, as illustrated in FIG. 13, the absorption nozzle 360 is moved from the stand-by part 362 to above an outer peripheral portion of the substrate to be processed W by the second arm 352. Subsequently, the absorption nozzle 360 is moved in the radial direction from one end portion W1 to another end portion W2 of the substrate to be processed W while the support part 310 (the substrate to be processed W) is rotated by the rotary mechanism 320. While the absorption nozzle 360 is moved from the end portion W1 to the end W2 of the substrate to be processed W, the peeling agent R is absorbed by the absorption nozzle 360. In this way, the absorption nozzle 360 absorbs the peeling agent R from the entire bonding surface Wj of the substrate to be processed W, whereby the peeling agent R is removed from the bonding surface Wj of the substrate to be processed W (Step A205 in FIG. 7). Therefore, a series of the cleaning process of the first cleaning device 151 is completed.

According to the present embodiment, since the solvent M of the protectant P is supplied from the solvent nozzle 353 to the bonding surface Wj of the substrate to be processed W in Step A202, the protectant P on the bonding surface Wj is dissolved and removed by the solvent M in step A203. By this way, the peeling agent R on the bonding surface Wj of the substrate to be processed W floats away from the bonding surface Wj, and then the peeling agent R is absorbed and removed by the absorption nozzle 360 in Step A205. Therefore, both of the protectant P and the peeling agent R can be removed regardless of the material of the peeling agent R, whereby the bonding surface Wj of the substrate to be processed W can be properly cleaned.

In the present embodiment, it is only necessary to supply the solvent M to the bonding surface Wj of the substrate to be processed W and the peeling agent R is removed without being dissolved. Accordingly, it is possible to clean the bonding surface Wj of the substrate to be processed W in a short time.

<4. Other Embodiments>

In the above embodiment, during Steps A202 and A203, the solvent M is supplied to the bonding surface Wj of the substrate to be processed W from the solvent nozzle 353 while the support part 310 (the substrate to be processed W) is rotated, thereby removing the protectant P in the bonding surface Wj. However, a removing method of the protectant P is not limited to the above embodiment. For example, the protectant P may be removed by moving upward the dicing frame F and immersing the protectant P of the bonding surface Wj in the solvent M supplied from the solvent nozzle 353.

Figure 14:
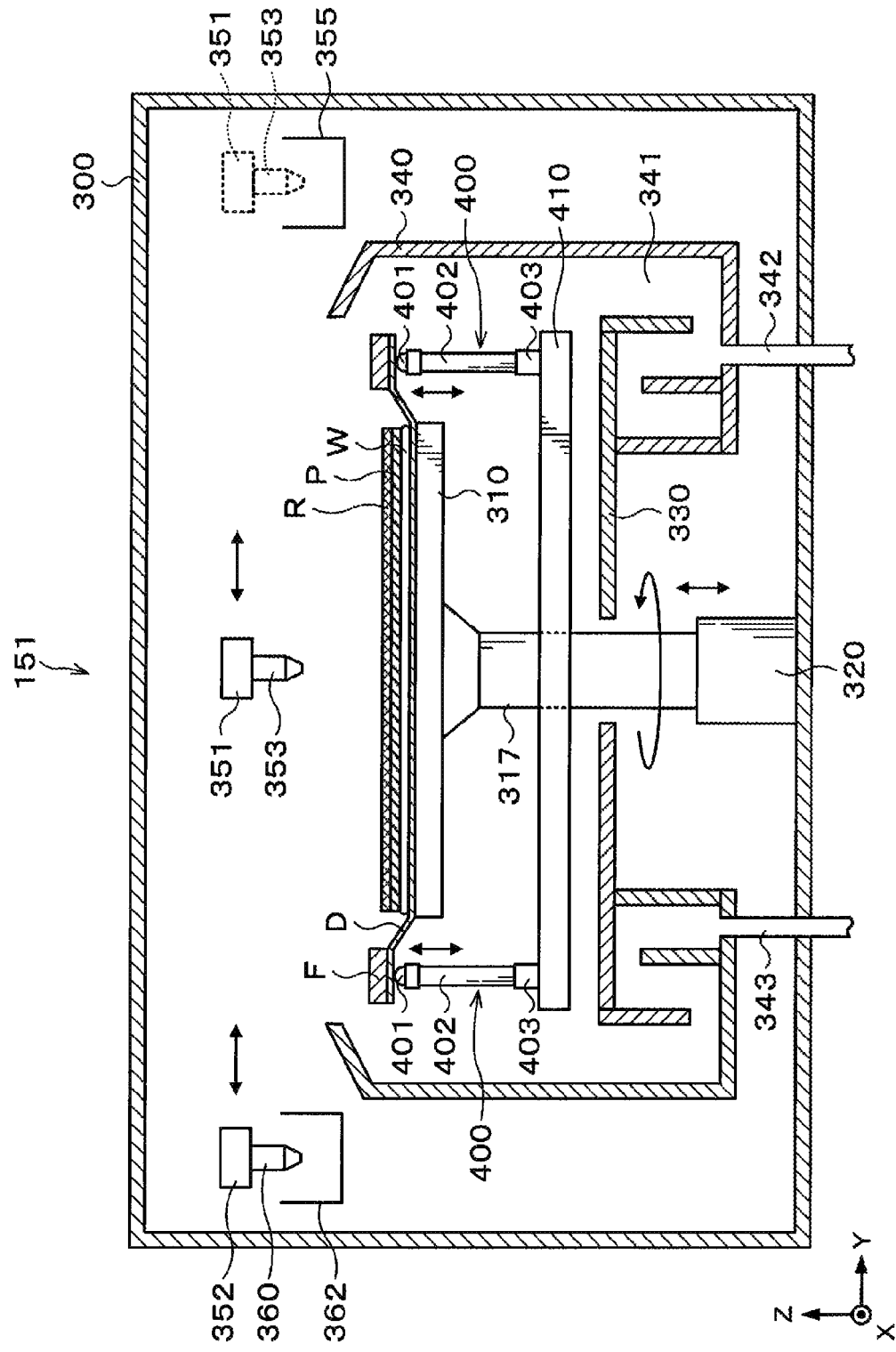
FIG. 14 is a vertical sectional view schematically illustrating a configuration of a first cleaning device according to another embodiment.

In this case, for example, the first cleaning device 151 illustrated in FIG. 14 may be used. In the process container 300 of the first cleaning device 151, an elevation mechanism 400 for elevating the dicing frame F is installed around the support part 310. The elevation mechanism 400 includes a ball bearing 401, a support member 402, and a driving part 403. The ball bearing 401 is supported by a leading end portion of the support member 402, and the driving part 403 is installed in a base end portion of the support member 402. The driving part 403 includes a driving source, for example, a motor or the like, and moves the ball bearing 401 vertically through the support member 402. The ball bearing 401 is arranged below the dicing frame F, and is brought into contact with the dicing tape D, which is attached to the dicing frame F, to move the dicing frame F vertically.

A plurality of the elevating mechanisms 400 is installed, and is supported by a base 410. The base 410 is configured such that the support member 317 is inserted through an inner portion of the base 410. The base 410 is fixed to the cup 340 by a fixing mechanism (not illustrated).

The configuration of the elevation mechanism 400 is not limited to the present embodiment. The elevation mechanism 400 may be configured arbitrarily, as long as it can elevate the dicing frame F. Since other configurations of the first cleaning device 151 are the same with those of the first cleaning device 151 in the aforementioned embodiment in FIG. 5, explanation thereof will be omitted.

Figure 15:
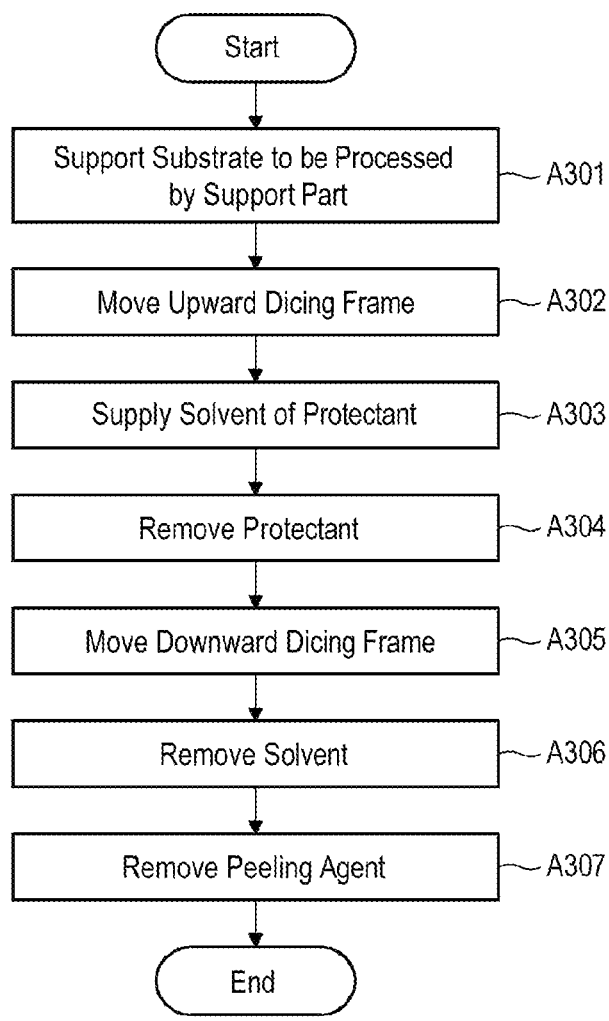
FIG. 15 is a flowchart illustrating main steps of a cleaning process of the first cleaning device according to another embodiment.

Next, a cleaning method of the bonding surface Wj of the substrate to be processed W using the first cleaning device 151 illustrated in FIG. 14 will be explained. FIG. 15 is a flowchart illustrating an example of main steps of the cleaning process. FIGS. 16 to 22 are diagrams for explaining the cleaning process. The first cleaning device 151 performs each of the process sequences illustrated in FIG. 15 under a control of the controller 30.

Figure 16:
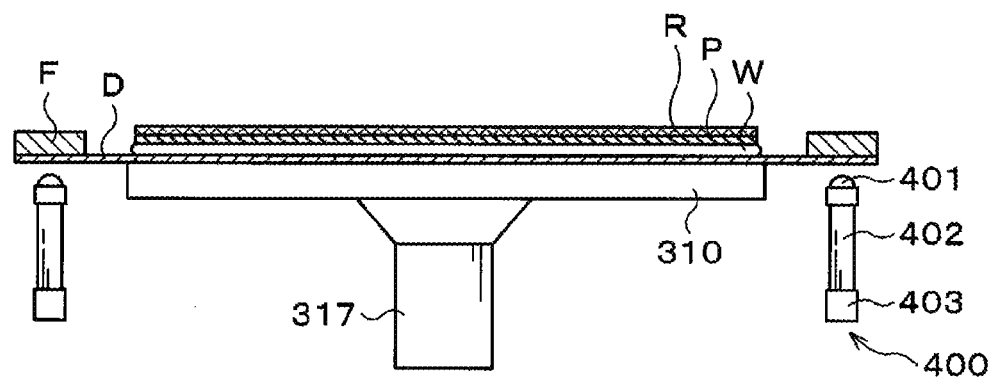
FIGS. 16 to 23 are diagrams for explaining the cleaning process of the first cleaning device according to another embodiment.

First, the substrate to be processed W loaded into the first cleaning device 151 by the first transfer device 131 is transferred to and supported by the support part 310 as illustrated in FIG. 16 (Step A301 in FIG. 15). At this time, the ball bearing 401 of the elevation mechanism 400 does not support the dicing frame F.

Figure 17:
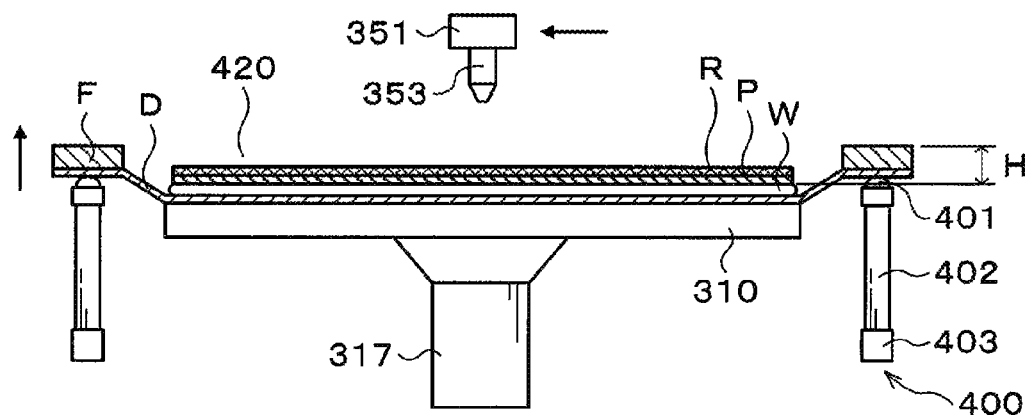

Subsequently, as illustrated in FIG. 17, the solvent nozzle 353 is moved from the stand-by part 355 to above the central portion of the substrate to be processed W by the first arm 351. In addition, the elevation mechanism 400 moves the dicing frame F up so that the dicing frame F is positioned higher than the substrate to be processed W (Step A302 in FIG. 15). Although the height of the dicing frame F may be set arbitrarily, it is necessary that the height is set to a position where the substrate to be processed W is properly supported by the support part 310 and where, at least, the protectant P of the bonding surface Wj of the substrate to be processed W is immersed in the solvent of the protectant P supplied from the solvent nozzle 353. Specifically, the dicing frame F is positioned so that a distance H between the front surface of the dicing frame F and the bonding surface Wj of the substrate to be processed W ranges, for example, from 5 to 10 mm. By positioning the dicing frame F higher than the substrate to be processed W, the dicing tape D is extended so that a reservoir space 420 where the solvent of the protectant P is temporarily stored is formed in the bonding surface Wj of the substrate to be processed W.

Figure 18:
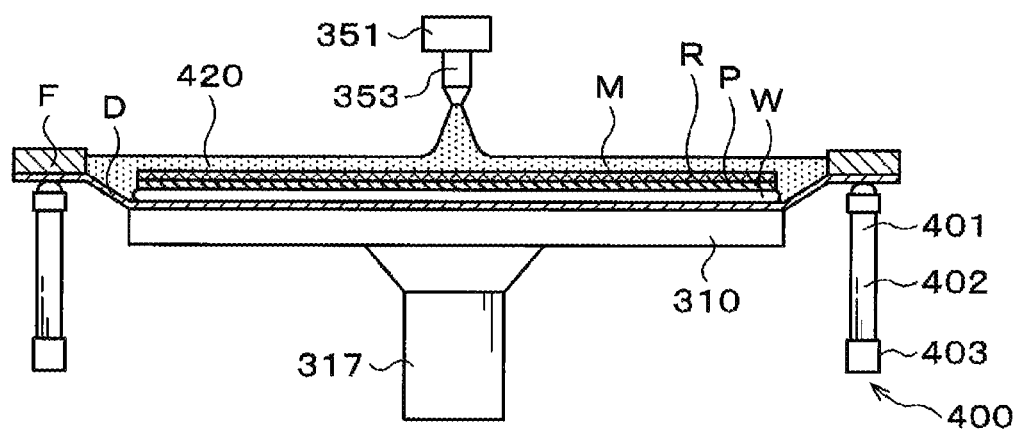

Thereafter, as illustrated in FIG. 18, the solvent M of the protectant P is supplied from the solvent nozzle 353 to the bonding surface Wj of the substrate to be processed W (Step A303 in FIG. 15). The supplied solvent M is stored in the reservoir space 420. Further, the protectant P in the bonding surface Wj of the substrate to be processed W is immersed in the solvent M of the reservoir space 420. If a predetermined amount of the solvent M is stored in the reservoir space 420, the supply of the solvent M from the solvent nozzle 353 is stopped and the solvent nozzle 353 is moved from above the central portion of the substrate to be processed W to the stand-by part 355 by the first arm 351.

Figure 19:
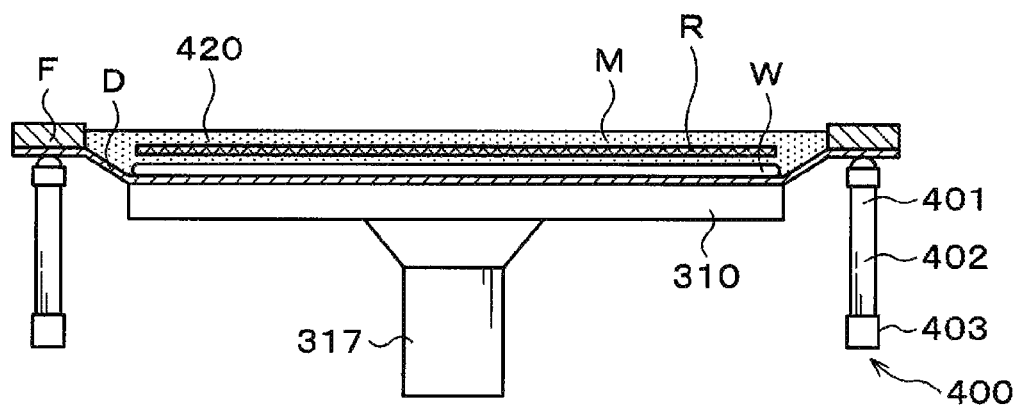

After a lapse of a predetermined time, as illustrated in FIG. 19, the protectant P in the bonding surface Wj of the substrate to be processed W is dissolved and removed by the solvent M (Step A304 in FIG. 15). At this time, if the peeling agent R is not or is hardly dissolved in the solvent M, for example, the peeling agent R floats away from the bonding surface Wj of the substrate to be processed W. In some cases, the peeling agent R together with the protectant P may be dissolved in the solvent M. In those cases, the cleaning process of the bonding surface Wj of the substrate to be processed W is completed by dissolving both the protectant P and the peeling agent R in the solvent M.

Figure 20:
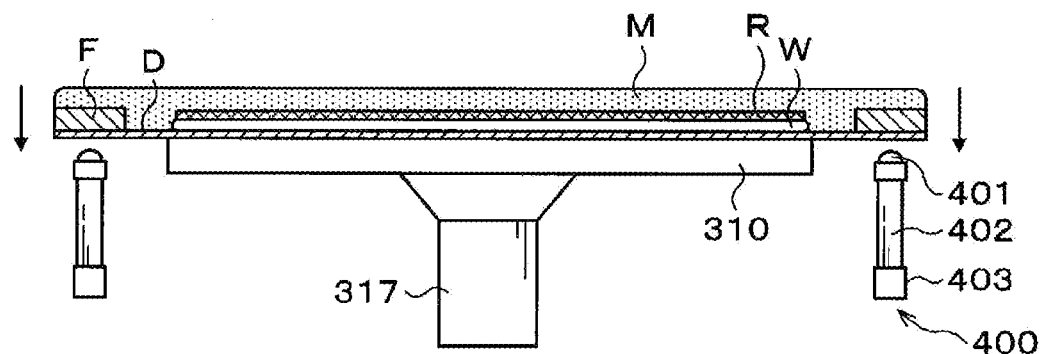

Thereafter, as illustrated in FIG. 20, the elevation mechanism 400 moves downward the dicing frame F (Step A305 in FIG. 15), so that the dicing frame F returns to a position where the dicing tape D becomes flat.

Figure 21:
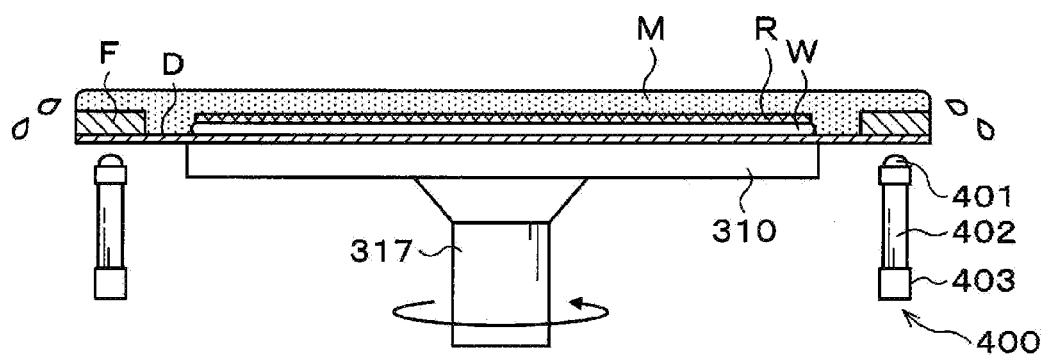

Thereafter, as illustrated in FIG. 21, the support part 310 (the substrate to be processed W) is rotated by the rotary mechanism 320, whereby the solvent M is scattered and removed outside of the bonding surface Wj of the substrate to be processed W by centrifugal force (Step A306 in FIG. 15). The scattered solvent M is collected into the cup 340 and is then drained from the drain pipe 342. At this time, although the peeling agent R remains in the bonding surface Wj of the substrate to be processed W, the peeling agent R just exists in the bonding surface Wj and is not bonded to the bonding surface Wj.

Figure 22:
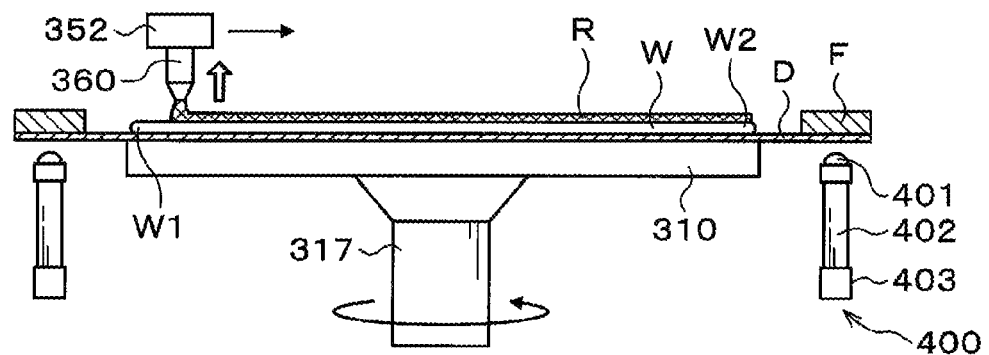

Thereafter, as illustrated in FIG. 22, the absorption nozzle 360 is moved from the stand-by part 362 to above an outer peripheral portion of the substrate to be processed W by the second arm 352. Subsequently, the absorption nozzle 360 is moved in the radial direction from one end portion W1 to another end portion W2 of the substrate to be processed W while the support part 310 (the substrate to be processed W)

is rotated by the rotary mechanism 320. While the absorption nozzle 360 is moved from the end portion W1 to the end portion W2 of the substrate to be processed W, the peeling agent R is absorbed by the absorption nozzle 360. In this way, the absorption nozzle 360 absorbs the peeling agent R from the entire bonding surface Wj of the substrate to be processed W, whereby the peeling agent R is removed from the bonding surface Wj of the substrate to be processed W (Step A307 in FIG. 15). Therefore, a series of the cleaning process of the first cleaning device 151 is completed.

This embodiment also has similar effect with the aforementioned embodiments. That is to say, the protectant P in the bonding surface Wj of the substrate to be processed W is dissolved to make the peeling agent R float away from the bonding surface Wj. In this way, both the protectant P and the peeling agent R can be removed regardless of the material of the peeling agent R, whereby the bonding surface Wj of the substrate to be processed W can be properly cleaned. In addition, it is only necessary to supply the solvent M to the bonding surface Wj of the substrate to be processed W, whereby it becomes possible to clean the bonding surface Wj of the substrate to be processed W in a short time.

According to the present embodiment, during Steps A303 and A304, the protectant P in the bonding surface Wj is removed by immersing the protectant P in the solvent M in the reservoir space 420. In this case, the bonding surface Wj of the substrate to be processed W can be cleaned in a shorter time in comparison with the case that a so-called spin method is used as in the aforementioned embodiment. According to a specific investigation made by the inventors, it takes about 900 seconds to clean the bonding substrate Wj using a conventional cleaning method. However, it takes about 60 to 600 seconds to clean the bonding substrate Wj using the method of the present embodiment.

In the spin method of the aforementioned embodiment, since the solvent M is supplied while the substrate to be processed W is rotated, the supplied solvent M is scattered from the substrate to be processed W. Therefore, it is necessary to supply a large amount of the solvent M. On the contrary, according to the present embodiment, since the supplied solvent M is stored in the reservoir space 420, all of the solvent M is used to dissolve the protectant P and no solvent M is wasted. Therefore, it is possible to suppress the supply amount of the solvent M to a small degree.

Further, as in the present embodiment, if the solvent M is stored in the reservoir space 420, it is possible to suppress the solvent M from going around the rear surface of the dicing frame F.

In the first cleaning device 151 of the present embodiment, the support part 310 (the substrate to be processed W) is stopped when the protectant P in the bonding surface Wj is dissolved and removed in the solvent M in the reservoir space 420 during Steps A303 and A304. However, the support part 310 may be rotated.

Figure 23:
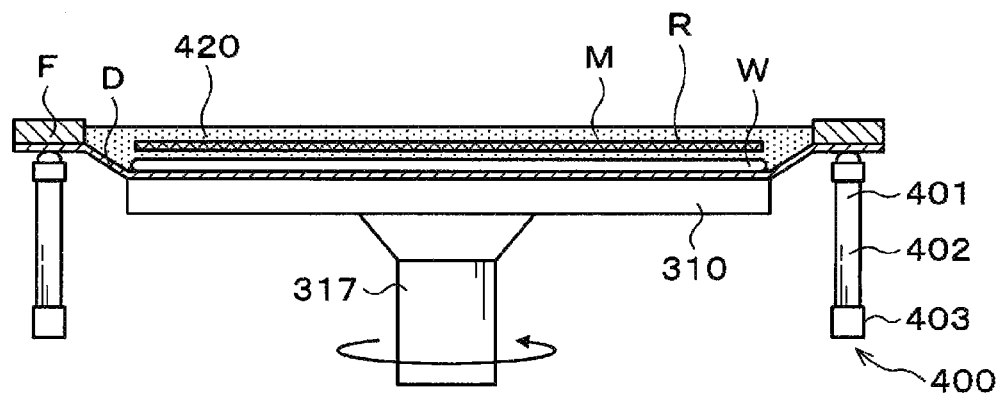

As illustrated in FIG. 23, the support part 310 (the substrate to be processed W) is rotated by the rotary mechanism 320 while the solvent M is stored in the reservoir space 420. At this time, since the ball bearing 401 is configured to be rotatable, the dicing frame F supported by the ball bearing 401 also rotates. In this case, vibration is applied to the solvent M stored in the reservoir space 420, which promotes dissolution of the protectant P by the solvent M. Therefore, according to the present embodiment, the bonding surface Wj of the substrate to be processed W can be cleaned in a shorter time.

Figure 24:
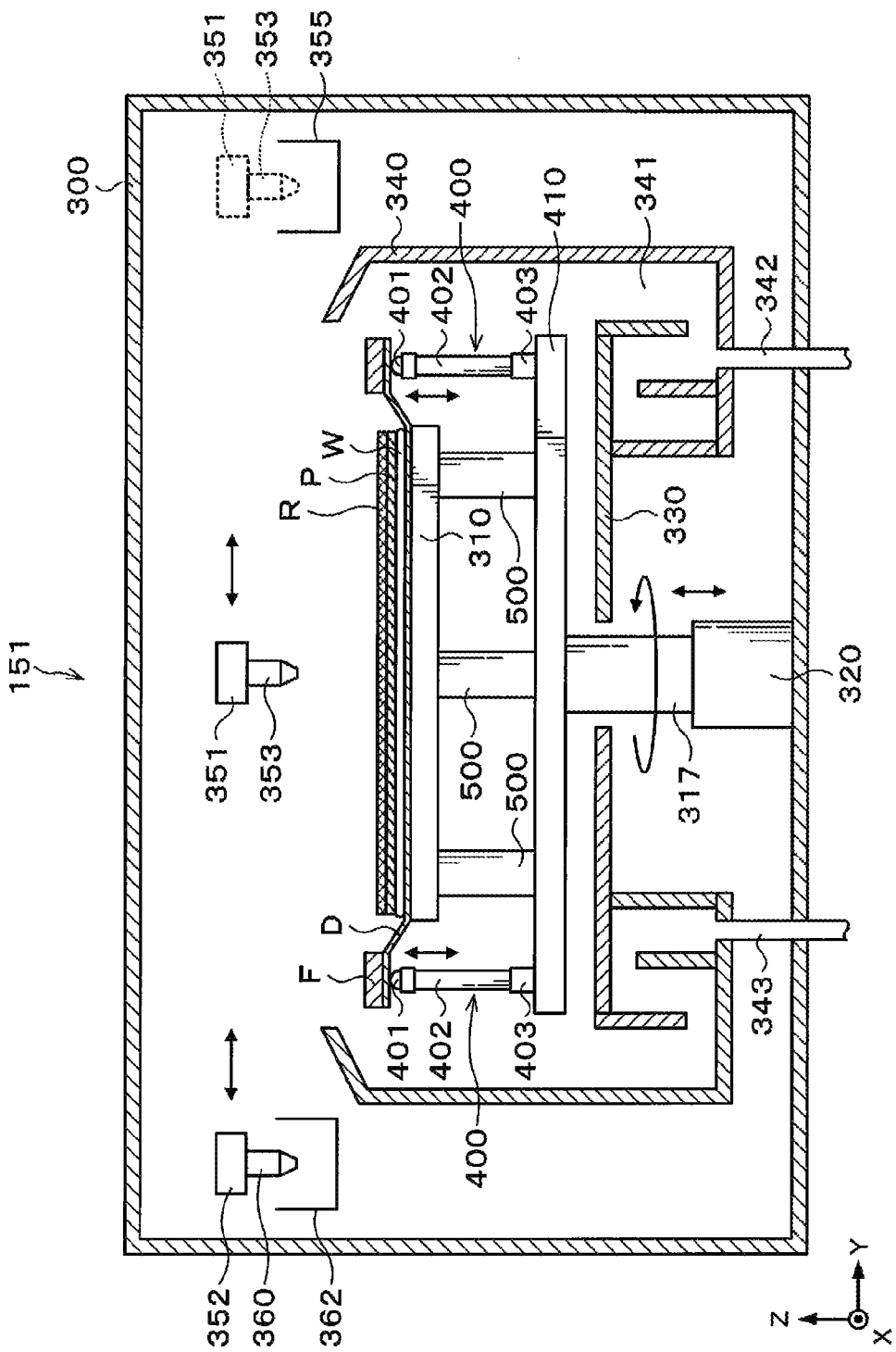
FIG. 24 is a vertical sectional view schematically illustrating a configuration of a first cleaning device according to still another embodiment.

Alternatively, in order to rotate the support part 310 during Steps A303 and A304, the first cleaning device 151 illustrated in FIG. 24, for example, may be used. In this first cleaning device 151, the base 410 supporting the elevation mechanism 400 also supports the support part 310 with a plurality of support members 500 interposed therebetween. Although the support member 317 directly supports the support part 310 in the aforementioned embodiment, the support member 317 supports the base 410 in this embodiment. By rotating the base 410 using the rotary mechanism 320, the support part 310, the support member 317 (the substrate to be processed W) and the elevation mechanism 400 (the dicing frame F) rotates together. In this case, since the substrate to be processed W and the dicing frame F rotate while the solvent M is stored in the reservoir space 420, the bonding surface Wj of the substrate to be processed W can be cleaned in a shorter time.

Figure 25:
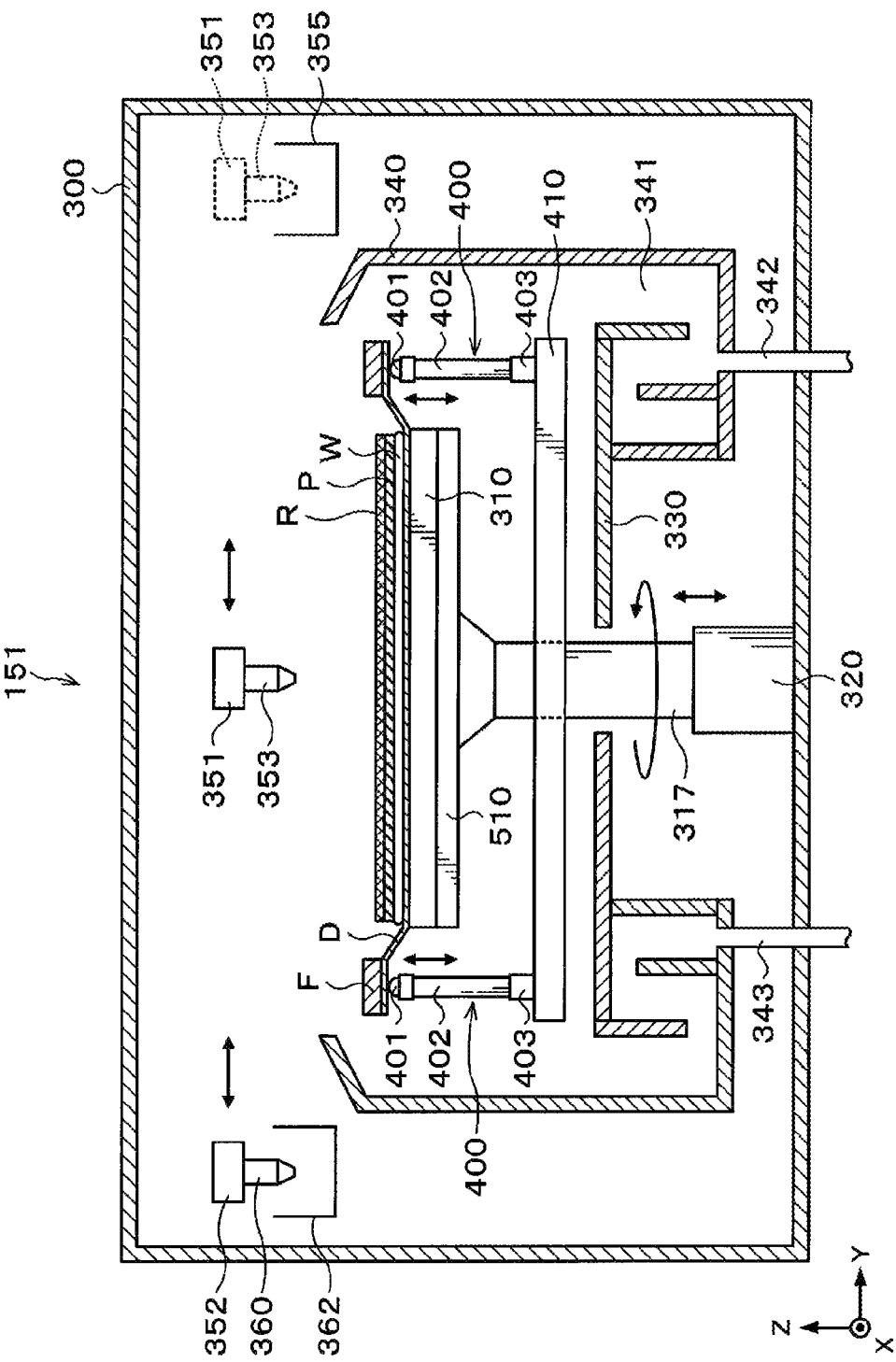
FIG. 25 is a vertical sectional view schematically illustrating a configuration of a first cleaning device according to still another embodiment.

In the first cleaning device 151 of the aforementioned embodiment, vibration may be applied to the solvent M supplied from the solvent nozzle 353. For example, in the first cleaning device 151 as illustrated in FIG. 25, a vibration mechanism 510 is installed at the bottom surface side of the support part 310. The vibration mechanism 510 generates, for example, ultrasonic waves to apply vibration to the solvent M. Configuration of the vibration mechanism 510 is not limited to the present embodiment, and the vibration may be applied by using methods other than the method of generating ultrasonic waves. Also, the arrangement of the vibration mechanism 510 is not limited to the present embodiment, and can be set arbitrarily. For example, the vibration mechanism 510 may be installed in the solvent nozzle 353 to apply vibration to the solvent M supplied from the solvent nozzle 353 to the bonding surface Wj of the substrate to be processed.

In this case, ultrasonic waves are generated by the vibration mechanism 510 and vibration is applied to the solvent M stored in the reservoir space 420 as illustrated in FIGS. 18 and 19. In this way, dissolution of the protectant P by the solvent M is promoted, whereby the bonding surface Wj of the substrate to be processed W can be cleaned in a shorter time. Moreover, if the solvent M is supplied from the solvent nozzle 353 while the support part 310 is rotated by the rotary mechanism 320 as shown in FIGS. 10 and 11, vibration is applied to the solvent M supplied to the bonding surface Wj of the substrate to be processed W, whereby dissolution of the protectant P by the solvent M can be promoted.

In the above described embodiments, although the peeling agent R is removed by using the absorption nozzle 360 during Step A307 (Step A205), the method for removing the peeling agent R is not limited thereto.

Figure 26:
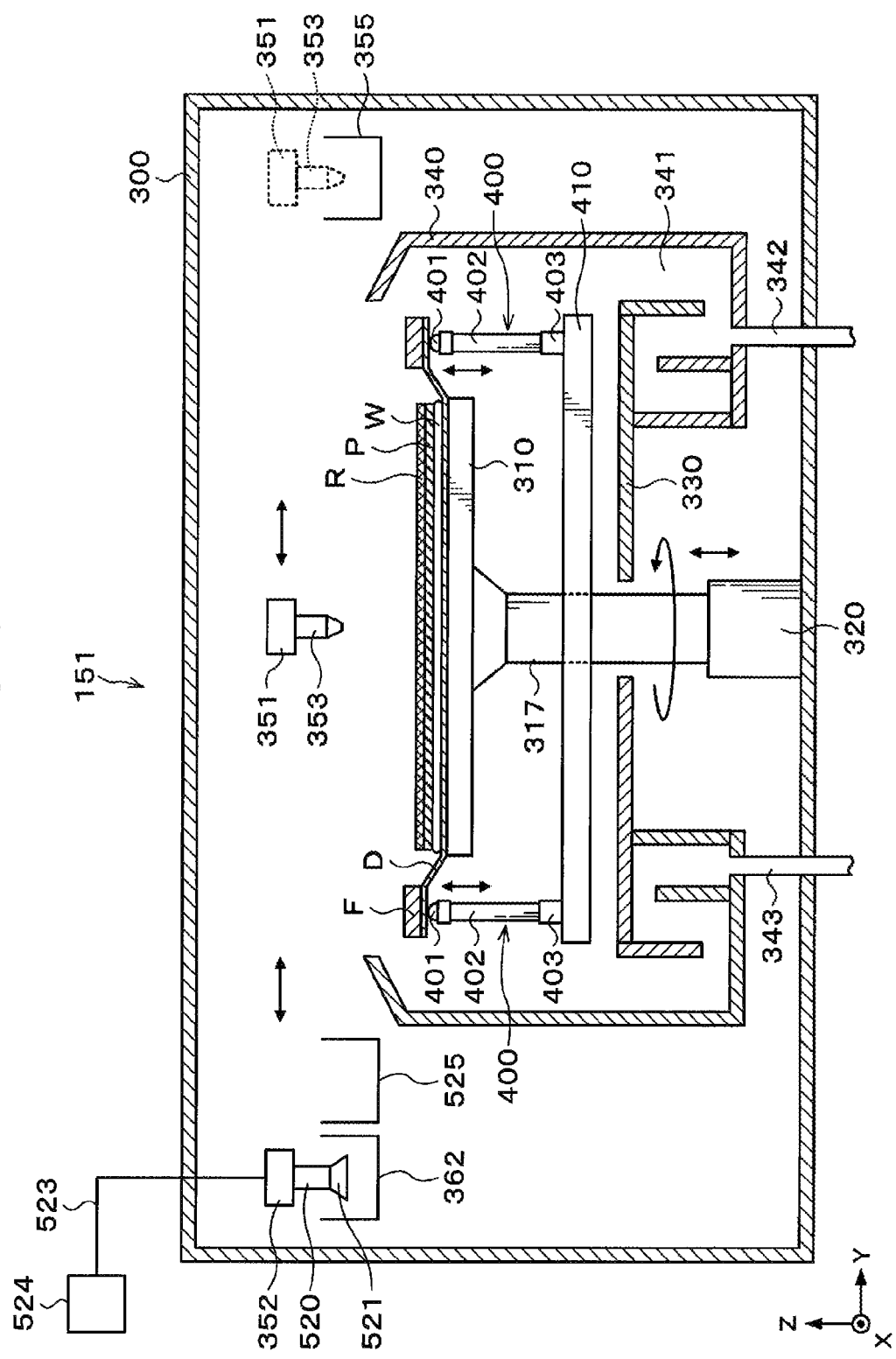
FIG. 26 is a vertical sectional view schematically illustrating a configuration of a first cleaning device according to still another embodiment.

For example, the peeling agent R in the bonding surface Wj of the substrate to be processed W may be removed by adsorption. In this case, the first cleaning device 151 illustrated in FIG. 26, for example, may be used. In the first cleaning device 151, an adsorption nozzle 520 is installed instead of the absorption nozzle 360. An adsorption pad 521 is installed in a leading end portion of the adsorption nozzle 520. The adsorption pad 521 is formed of elastic material such as rubber or the like. An intake hole (not illustrated) is formed in the adsorption pad 521, and an intake pipe 523 is connected to the intake hole through the adsorption nozzle 520. The intake pipe 523 communicates with a negative pressure generating device 524 such as a vacuum pump or the like. Further, the peeling agent R in the bonding surface Wj of the substrate to be processed W is attracted by the negative pressure generating device 524 and is adsorbed to the adhesion pad. Inside of the process container 300, a waste container 525 in which the peeling agent R can be stored is installed, for example, at the outside of the cup 340 in the negative y-axis direction. The peeling agent R removed by adsorption using the adsorption pad 521 is collected in the waste container 525. In the present embodiment, a plurality of adsorption nozzles 520 and adsorption pads 521 may be installed. The adsorption nozzle 520 and the adsorption pad 521 constitute the peeling agent adsorption part of the present disclosure.

Figure 27:
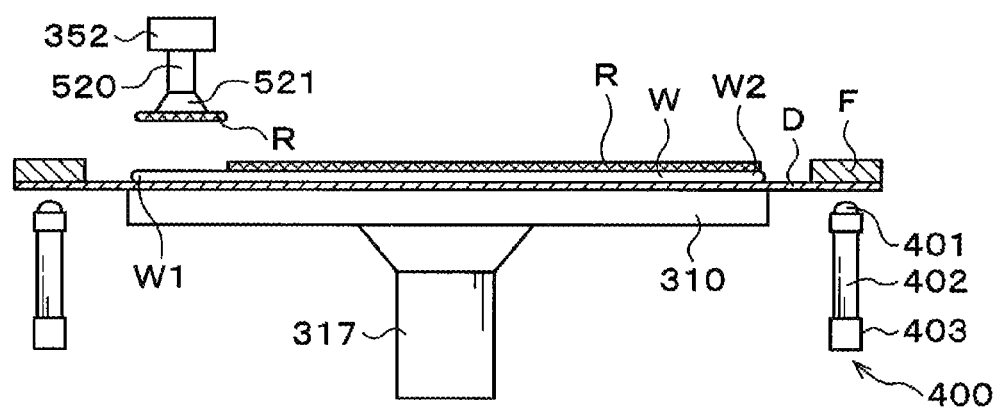
FIG. 27 is a diagram for explaining a cleaning process of the first cleaning device illustrated in FIG. 26.

In this case, as illustrated in FIG. 27, the adsorption nozzle 520 is moved to above one end portion W1 of the substrate to be processed W by the second arm 352. Thereafter, the peeling agent R is adsorbed by the adsorption pad 521 and the adsorption nozzle 520 is moved to the waste container 525 by the second arm 352. Then, the peeling agent R removed by adsorption using the adsorption pad 521 is collected in the waste container 525. Thereafter, the adsorption nozzle 520 is again moved from the end portion W1 of the substrate to be processed W to above another end portion W2 of the same while the support part 310 (the substrate to be processed W) is rotated by the rotary mechanism 320, whereby a portion of the bonding surface Wj of the substrate to be processed W where the peeling agent R is not yet removed is positioned below the adsorption pad 521. Then, the peeling agent R is removed by adsorption using the adsorption pad 521 and is collected into the waste container 525. In this way, removal of the peeling agent R by adsorption using the adsorption pad 521 and collection of the peeling agent R into the waste container 525 are repeatedly performed by moving the adsorption nozzle 520 in the radial direction from the end portion W1 to the end portion W2 of the substrate to be processed W while the substrate to be processed W is rotated by the rotary mechanism 320, whereby the peeling agent R is properly removed from the bonding surface Wj of the substrate to be processed W.

Figure 28:
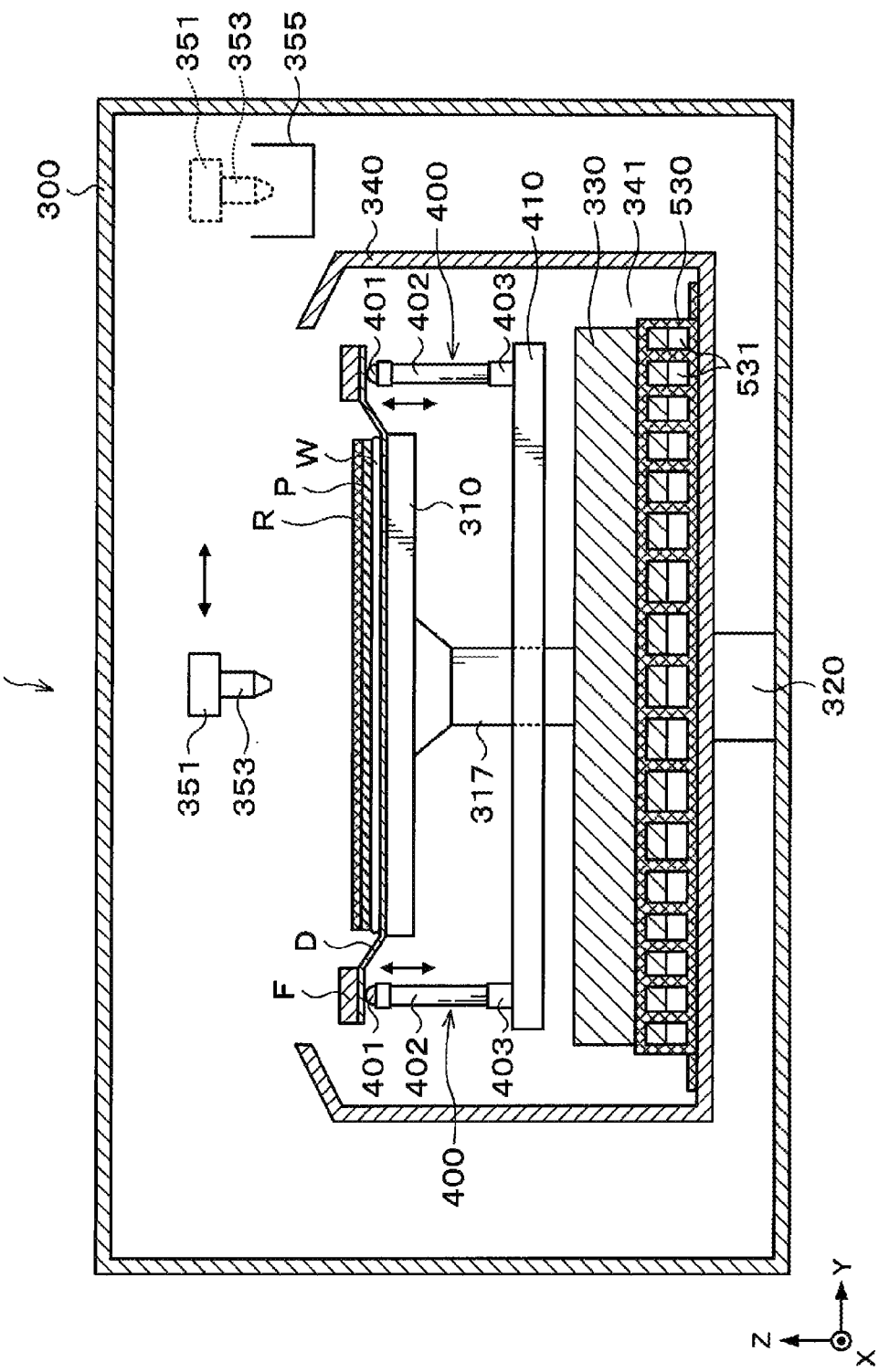
FIG. 28 is a vertical sectional view schematically illustrating a configuration of a first cleaning device according to still another embodiment.

Alternatively, for example, the peeling agent R in the bonding surface Wj of the substrate to be processed W can be removed by scattering the peeling agent R from the bonding surface Wj outside of the substrate to be processed W. In this case, the first cleaning device 151 illustrated in FIG. 28, for example, may be used. In the first cleaning device 151, a ring mesh 530 as a collecting part for collecting the peeling agent R is installed in the cup 340. The ring mesh 530 is installed in a gap 341 within the cup 340 to surround the guide ring 330. A plurality of openings 531 is formed in the ring mesh 530. In this embodiment, the absorption nozzle 360, the adsorption nozzle 520 and the adsorption pad 521 may be omitted.

In this case, during Step A306, the solvent M, which is scattered outside of the bonding surface Wj of the substrate to be processed W and is collected by the cup 340, passes through the openings 531 of the ring mesh 530, flows into the gas-liquid separation part of the cup 340, and then is discharged from the drain pipe 342.

Thereafter, during step A307, the support part 310 (the substrate to be processed W) is rotated by the rotary mechanism 320, whereby the peeling agent R is scattered and removed outside of the bonding surface Wj of the substrate to be processed W. The scattered peeling agent R is collected in the cup 340 and trapped by the ring mesh 530. In other words, since the peeling agent R does not flow into the gas-liquid separation part, the gas-liquid separation part or the drain pipe 342 is not blocked by the peeling agent R. Therefore, in this embodiment, the peeling agent R can be properly removed from the bonding surface Wj of the substrate to be processed W.

In the aforementioned embodiments, examples in which the overlapped substrate T is supported by the dicing frame F are explained. However, it is not necessary to support the overlapped substrate T by the dicing frame F.

The overlapped substrate is peeled off at the interface between the peeling agent and the adhesive, and the protectant and the peeling agent remain in the bonding surface of the peeled substrate to be processed. According to the present disclosure, since the solvent of the protectant is supplied from the solvent supply part to the bonding surface of the substrate to be processed, the protectant remaining in the bonding surface is dissolved and removed by the solvent. By doing this, the peeling agent in the bonding surface of the substrate to be processed floats away from the bonding surface, so that the peeling agent is also removed. Accordingly, both the protectant and the peeling agent can be removed regardless of material of the peeling agent, and thus the bonding surface of the substrate to be processed can be properly cleaned. In addition, according to the present disclosure, it is only necessary to supply the solvent of the protectant to the bonding surface of the substrate to be processed, and both the peeling agent and the protectant are removed without dissolving the peeling agent. Accordingly, it is possible to clean the bonding surface of the substrate to be processed in a short time.

According to the present disclosure, the bonding surface of the substrate to be processed peeled from the support substrate can be cleaned properly and efficiently.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method that peels off an overlapped substrate and cleans a bonding surface of a peeled substrate to be processed, the overlapped substrate including the substrate to be processed and a support substrate bonded together with a protectant, a peeling agent and an adhesive stacked in order therebetween from the substrate to be processed, the cleaning method comprising:
   removing the protectant by supplying a solvent of the protectant from a solvent supply part to the bonding surface of the substrate to be processed; and
   removing the peeling agent by absorbing the peeling agent, which has been peeled from the bonding surface of the substrate to be processed, using a peeling agent absorption part.

2. The cleaning method of claim 1, wherein in removing the protectant, the protectant is dissolved by supplying the solvent from the solvent supply part to the bonding surface of the substrate to be processed while the substrate to be processed is rotated.

3. The cleaning method of claim 1, wherein in removing the peeling agent, the peeling agent is absorbed by the peeling agent absorption part while the substrate to be processed is rotated and while the peeling agent absorption part is moved in a radial direction of the substrate to be processed from one end portion of an outer peripheral portion of the substrate to be processed.

4. The cleaning method of claim 1, wherein the substrate to be processed is supported by a frame such that the substrate to be processed is arranged in an opening of the frame, the opening having a diameter larger than that of the substrate to be processed, and that a non-bonding surface of the substrate to be processed is attached to a tape installed in the opening.

5. The cleaning method of claim 4, wherein at least one of removing the protectant and removing the peeling agent is performed while the substrate to be processed and the frame are rotated.

6. The cleaning method of claim 1, wherein removing the protectant includes applying a vibration to the solvent supplied from the solvent supply part.

7. The cleaning method of claim 1, wherein removing the peeling agent includes:
- collecting the peeling agent which has been peeled from the bonding surface of the substrate to be processed; and
- trapping the collected peeling agent.

8. A non-transitory computer-readable storage medium storing a program which, when executed by a computer of a controller that controls a cleaning device, performs the cleaning method as set forth in claim 1 in the cleaning device.

* * * * *